US008653537B2

(12) United States Patent
He et al.

(10) Patent No.: US 8,653,537 B2
(45) Date of Patent: Feb. 18, 2014

(54) LAYER ASSEMBLY FOR A LIGHT-EMITTING COMPONENT

(75) Inventors: Gufeng He, Dresden (DE); Martin Pfeiffer, Dresden (DE); Jan Blochwitz-Nimoth, Dresden (DE)

(73) Assignee: Novaled AG, Dresden (DE)

( * ) Notice: Subject to any disclaimer, the term of this patent is extended or adjusted under 35 U.S.C. 154(b) by 1345 days.

(21) Appl. No.: 11/573,617

(22) PCT Filed: Jun. 16, 2005

(86) PCT No.: PCT/DE2005/001076
§ 371 (c)(1),
(2), (4) Date: Oct. 12, 2007

(87) PCT Pub. No.: WO2006/015567
PCT Pub. Date: Feb. 16, 2006

(65) Prior Publication Data
US 2008/0203406 A1   Aug. 28, 2008

(30) Foreign Application Priority Data

Aug. 13, 2004  (DE) .......................... 10 2004 039 594
Aug. 13, 2004  (EP) ..................................... 04019276

(51) Int. Cl.
*H01L 27/15*   (2006.01)
(52) U.S. Cl.
USPC ................... 257/79; 257/40; 257/72; 257/89; 257/94; 257/99
(58) Field of Classification Search
None
See application file for complete search history.

(56) References Cited

U.S. PATENT DOCUMENTS 4,356,429 A  10/1982 Tang
4,769,292 A   9/1988 Tang et al.
(Continued)

FOREIGN PATENT DOCUMENTS

CA  2549309  9/2005
DE  4446818  7/1996
(Continued)

OTHER PUBLICATIONS

Jou, J.-H., et al. "Efficient, Color-Stable Fluorescent White Organic Light-Emitting Diodes with an Effective Exciton-Confining Device Architecture." Org. Elect., vol. 7 (2006): pp. 8-15.*

(Continued)

*Primary Examiner* — Kyoung Lee
(74) *Attorney, Agent, or Firm* — Sutherland Asbill & Brennan LLP

(57) ABSTRACT

The invention relates to a layer assembly for a light-emitting component, in particular a phosphorescent organic light-emitting diode, having a hole-injecting contact and an electron-injecting contact which are each connected to a light-emitting region, wherein, in the light-emitting region, one light-emitting layer is made up of a material (M1) and another light-emitting layer is made up of another material (M2), where the material (M1) is ambipolar and preferentially transports holes and the other material (M2) is ambipolar and preferentially transports electrons; a heterotransition is formed by the material (M1) and the other material (M2) in the light-emitting region; an interface between the material (M1) and the other material (M2) is of the staggered type II; the material (M1) and the other material (M2) each contain an appropriate addition of one or more triplet emitter dopants; and an energy barrier for transfer of holes from the material (M1) into the other material (M2) and an energy barrier for transfer of electrons from the other material (M2) into the material (M1) are each less than about 0.4 eV.

29 Claims, 7 Drawing Sheets

(56) References Cited

U.S. PATENT DOCUMENTS

| | | | |
|---|---|---|---|
| 5,093,698 A | 3/1992 | Egusa | |
| 5,500,537 A | 3/1996 | Tsumura et al. | |
| 5,703,436 A | 12/1997 | Forrest et al. | |
| 5,757,026 A | 5/1998 | Forrest et al. | |
| 5,811,833 A | 9/1998 | Thompson | |
| 5,840,217 A | 11/1998 | Lupo et al. | |
| 5,917,280 A | 6/1999 | Burrows et al. | |
| 5,969,474 A | 10/1999 | Aria | |
| 5,989,785 A | 11/1999 | Ishihara et al. | |
| 6,023,073 A | 2/2000 | Strite | |
| 6,107,734 A | 8/2000 | Tanaka et al. | |
| 6,224,966 B1* | 5/2001 | Sakai et al. | 428/212 |
| 6,274,980 B1 | 8/2001 | Burrows et al. | |
| 6,303,238 B1 | 10/2001 | Thompson et al. | |
| 6,310,360 B1 | 10/2001 | Forrest et al. | |
| 6,337,492 B1 | 1/2002 | Jones et al. | |
| 6,406,804 B1 | 6/2002 | Higashi et al. | |
| 6,437,769 B1 | 8/2002 | Kohayashi | |
| 6,528,188 B1* | 3/2003 | Suzuki et al. | 428/690 |
| 6,541,909 B1 | 4/2003 | Motomatsu | |
| 6,555,840 B1 | 4/2003 | Hudson et al. | |
| 6,566,807 B1 | 5/2003 | Fujita et al. | |
| 6,573,651 B2 | 6/2003 | Adachi et al. | |
| 6,579,422 B1 | 6/2003 | Kasinuma | |
| 6,580,027 B2 | 6/2003 | Forrest et al. | |
| 6,589,673 B1 | 7/2003 | Kido et al. | |
| 6,614,176 B2* | 9/2003 | Kim et al. | 313/506 |
| 6,645,645 B1 | 11/2003 | Adachi et al. | |
| 6,720,573 B2 | 4/2004 | Son | |
| 6,734,457 B2 | 5/2004 | Yamazaki et al. | |
| 6,831,406 B1* | 12/2004 | Fukuyama et al. | 313/504 |
| 6,835,470 B1 | 12/2004 | Magain | |
| 6,867,538 B2 | 3/2005 | Adachi et al. | |
| 6,878,297 B1 | 4/2005 | Berger | |
| 6,897,473 B1 | 5/2005 | Burroughes et al. | |
| 6,900,588 B2 | 5/2005 | Adachi et al. | |
| 6,908,783 B1 | 6/2005 | Kuehl et al. | |
| 6,911,666 B2 | 6/2005 | Voutsas et al. | |
| 6,933,522 B2 | 8/2005 | Lin et al. | |
| 6,936,961 B2 | 8/2005 | Liao et al. | |
| 6,965,197 B2 | 11/2005 | Tyan | |
| 6,979,414 B2 | 12/2005 | Hosokawa et al. | |
| 7,001,536 B2 | 2/2006 | Thompson et al. | |
| 7,074,500 B2 | 7/2006 | Pfeiffer et al. | |
| 7,161,292 B2 | 1/2007 | Leo | |
| 7,192,659 B2* | 3/2007 | Ricks et al. | 428/690 |
| 7,288,330 B2* | 10/2007 | Hatwar et al. | 428/690 |
| 7,301,167 B2 | 11/2007 | Ko | |
| 7,332,857 B2 | 2/2008 | Seo et al. | |
| 7,473,410 B1 | 1/2009 | Huffman et al. | |
| 2001/0033136 A1 | 10/2001 | Kawase | |
| 2002/0030440 A1 | 3/2002 | Yamazaki | |
| 2002/0041975 A1 | 4/2002 | Ueda et al. | |
| 2002/0048688 A1 | 4/2002 | Fukuoka et al. | |
| 2002/0071082 A1 | 6/2002 | Okita et al. | |
| 2002/0084993 A1 | 7/2002 | Teneya | |
| 2002/0098379 A1 | 7/2002 | Arakane et al. | |
| 2002/0109136 A1* | 8/2002 | Seo et al. | 257/40 |
| 2003/0020073 A1 | 1/2003 | Long et al. | |
| 2003/0042848 A1 | 3/2003 | Park et al. | |
| 2003/0052616 A1 | 3/2003 | Antoniadis et al. | |
| 2003/0098946 A1 | 5/2003 | Blaessing et al. | |
| 2003/0127973 A1 | 7/2003 | Weaver et al. | |
| 2003/0146443 A1 | 8/2003 | Atsushi et al. | |
| 2003/0170491 A1 | 9/2003 | Liao et al. | |
| 2003/0175553 A1* | 9/2003 | Thompson et al. | 428/690 |
| 2003/0178619 A1 | 9/2003 | Forrest et al. | |
| 2003/0189401 A1 | 10/2003 | Kido et al. | |
| 2003/0230980 A1 | 12/2003 | Forrest et al. | |
| 2004/0012980 A1 | 1/2004 | Sugiura et al. | |
| 2004/0032220 A1 | 2/2004 | Cok et al. | |
| 2004/0062949 A1 | 4/2004 | Pfeiffer et al. | |
| 2004/0067324 A1 | 4/2004 | Lazarev et al. | |
| 2004/0104394 A1* | 6/2004 | Lin et al. | 257/79 |
| 2004/0113547 A1 | 6/2004 | Son | |
| 2004/0119400 A1 | 6/2004 | Takahashi et al. | |
| 2004/0124766 A1* | 7/2004 | Nakagawa et al. | 313/504 |
| 2004/0150330 A1 | 8/2004 | Suh et al. | |
| 2004/0183067 A1 | 9/2004 | Strip et al. | |
| 2004/0183082 A1* | 9/2004 | Yamazaki | 257/79 |
| 2004/0191952 A1 | 9/2004 | Shtein et al. | |
| 2004/0201018 A1 | 10/2004 | Yamahara et al. | |
| 2004/0214041 A1 | 10/2004 | Lu | |
| 2004/0227460 A1 | 11/2004 | Liao et al. | |
| 2004/0235209 A1 | 11/2004 | Hasegawa et al. | |
| 2004/0251816 A1 | 12/2004 | Leo et al. | |
| 2005/0029933 A1 | 2/2005 | Liao et al. | |
| 2005/0040390 A1 | 2/2005 | Pfeiffer et al. | |
| 2005/0040392 A1 | 2/2005 | Wu et al. | |
| 2005/0053801 A1 | 3/2005 | Elschner et al. | |
| 2005/0061232 A1 | 3/2005 | Werner et al. | |
| 2005/0073251 A1 | 4/2005 | Kato | |
| 2005/0086251 A1 | 4/2005 | Hatscher et al. | |
| 2005/0095736 A1 | 5/2005 | Padiyath et al. | |
| 2005/0110009 A1 | 5/2005 | Blochwitz-Nimoth et al. | |
| 2005/0118745 A1 | 6/2005 | Yamazaki et al. | |
| 2005/0168137 A1* | 8/2005 | Adamovich et al. | 313/504 |
| 2005/0173700 A1 | 8/2005 | Liao et al. | |
| 2005/0189875 A1 | 9/2005 | Nakada | |
| 2005/0218797 A1 | 10/2005 | Bechtel et al. | |
| 2005/0255334 A1 | 11/2005 | Kang et al. | |
| 2005/0269943 A1 | 12/2005 | Hack et al. | |
| 2005/0270279 A1 | 12/2005 | Giraldo et al. | |
| 2006/0033115 A1 | 2/2006 | Blochwitz et al. | |
| 2006/0038170 A1 | 2/2006 | Brunschwiler et al. | |
| 2006/0061266 A1 | 3/2006 | Kang et al. | |
| 2006/0065904 A1 | 3/2006 | Uemura et al. | |
| 2006/0145365 A1 | 7/2006 | Halls et al. | |
| 2006/0172147 A1* | 8/2006 | Matsuura et al. | 428/690 |
| 2006/0175958 A1* | 8/2006 | Gerhard et al. | 313/504 |
| 2006/0202196 A1 | 9/2006 | Kawakami et al. | |
| 2006/0231843 A1 | 10/2006 | Qin et al. | |
| 2006/0232992 A1 | 10/2006 | Bertram et al. | |
| 2006/0238112 A1 | 10/2006 | Kasama et al. | |
| 2006/0250076 A1 | 11/2006 | Hofmann et al. | |
| 2006/0273310 A1 | 12/2006 | Birnstock et al. | |
| 2007/0034860 A1 | 2/2007 | Nakamura et al. | |
| 2007/0051946 A1 | 3/2007 | Walzer et al. | |
| 2007/0278479 A1 | 12/2007 | Werner et al. | |
| 2008/0143250 A1 | 6/2008 | Blochwitz-Nimoth et al. | |
| 2008/0164807 A1 | 7/2008 | Hofmann et al. | |
| 2009/0009071 A1 | 1/2009 | Murano et al. | |
| 2009/0009072 A1 | 1/2009 | Wellmann et al. | |

FOREIGN PATENT DOCUMENTS

| | | |
|---|---|---|
| DE | 19916745 | 10/2000 |
| DE | 10224021 | 12/2003 |
| DE | 10229231 | 1/2004 |
| EP | 0992564 | 4/2000 |
| EP | 1202608 A2 | 5/2002 |
| EP | 1227466 | 7/2002 |
| EP | 1282101 | 2/2003 |
| EP | 1318499 | 6/2003 |
| GB | 2361356 | 10/2001 |
| GB | 2388236 | 11/2003 |
| GB | 2390215 | 12/2003 |
| GB | 2392023 | 2/2004 |
| JP | 5931865 | 2/1984 |
| JP | 03208689 | 9/1991 |
| JP | 07-142169 | 11/1993 |
| JP | 05-034692 | 12/1993 |
| JP | 11283750 | 10/1999 |
| JP | 2000-231992 | 8/2000 |
| JP | 2003203769 | 7/2003 |
| JP | 2003297561 | 10/2003 |
| JP | 2004119197 | 4/2004 |
| JP | 2004-522276 | 7/2004 |
| JP | 2004214120 | 7/2004 |
| JP | 2004234942 | 8/2004 |
| JP | 2005156925 | 6/2005 |
| TW | 200401017 | 1/2004 |
| WO | 9948160 | 9/1999 |
| WO | 0108230 | 2/2001 |

(56) References Cited

FOREIGN PATENT DOCUMENTS

| WO | WO 01/27910 | 4/2001 |
|---|---|---|
| WO | 0193642 | 12/2001 |
| WO | 0241414 | 5/2002 |
| WO | WO 02/37580 | 5/2002 |
| WO | WO02/066552 A1 | 8/2002 |
| WO | 02071813 | 9/2002 |
| WO | 02091814 | 11/2002 |
| WO | WO 02/093664 | 11/2002 |
| WO | WO 03/069958 | 8/2003 |
| WO | WO 03/088271 | 10/2003 |
| WO | 03100880 | 12/2003 |
| WO | WO 2004/025615 | 3/2004 |
| WO | WO 2004/059606 | 7/2004 |
| WO | WO 2004/097954 | 11/2004 |
| WO | WO 2005/008801 | 1/2005 |
| WO | WO 2005/089288 | 9/2005 |

OTHER PUBLICATIONS

Hill, I.G. & Kahn, A. "Organic Semiconductor Heterointerfaces Containing Bathocuproine." J. Appl. Phys., vol. 86, No. 8 (Oct. 15, 1999): pp. 4515-4519.*
Adachi, C., et al. "High-Efficiency Organic Electrophosphorescent Devices with Tris(2-phenylpyridine)iridium Doped Into Electron-Transporting Materials." Appl. Phys. Lett., vol. 77, No. 6 (Aug. 7, 2000): pp. 904-906.*
Huang, J., et al. "Low-Voltage Organic Electroluminescent Devices Using pin Structures." Appl. Phys. Lett., vol. 80, No. 1 (Jan. 7, 2002): pp. 139-141.*
Baldo, M.A., et al. "Highly Efficient Phosphorescent Emission from Organic Electroluminescent Devices." Nature, vol. 395 (Sep. 10, 1998): pp. 151-154.*
Yuichi Hino et al, Efficient Low-Molecule Phosphorescent Organic Light-Emitting Diodes Fabricated by Wet-Processing, Organic Electronics, Aug. 8, 2004, vol. 5, pp. 265-270.
X. Zhou et al., High-Efficiency Electrophosphorescent Organic Light-Emitting Diodes with Double Light-Emitting Layers, Applied Physics Letters, Nov. 18, 2002, vol. 81, No. 21, pp. 4070-4072.
Gufeng He et al, High-Efficiency and Low-Voltage P-I-N Electorphosphorescent OLEDs with Double-Doping Emission Layers, Sep. 2004, Proceedings of the International Society for Optical Engineers, vol. 5464, No. 1, pp. 26-311.
Chung-Chih Wu et al, Efficient Organic Blue-Light-Emitting Devices with Double Confinement on Terfluorenes with Ambipolar Carrier Transport Properties, Advanced Materials, Jan. 5, 2004, vol. 16, No. 1, pp. 61-65.
Shuzuo Tokito et al, Improvement of Emission Efficiency in Polymer Light-Emitting Devices based on Phosphorescent Polymers, Thin Solid Films, Dec. 15, 2003, vol. 445, No. 2, pp. 353-357.
M.A. Baldo et al, Very High-Efficiency Green Organic Light-Emitting Devices Based on Electrophosphorescence, Applied Physics Letters, Jul. 5, 1999, vol. 75, No. 1, pp. 4-6.
Chihaya Adachi et al, High-Efficiency Organic Electrophosphorescent Devices with tris (2-PHenylpyridine)iridium Doped into Electron-Transporting Materials, Applied Physics Letters, Aug. 7, 2000, vol. 77, No. 6, pp. 904-906.
Masamichi Ikai et al, Highly Efficient Phosphorescence from Organic Light-Emitting Devices with an Exciton-Block Layer, Applied Physics Letters, Jul. 9, 2001, vol. 79, No. 2, pp. 156-158.
Wenping Hu et al, Efficient Red Electroluminescence from Devices having Multilayers of a Europium Complex, Applied Physics Letters, Dec. 25, 2000, vol. 77, No. 26, pp. 4271-4273.
Alasdair J. Campbell et al, Dispersive Electron Transport in an Electroluminescent Polyfluorene Copolymer Measured by the Current Integration Time-of-Flight Method, Applied Physics Letters, Oct. 1, 2001, vol. 79, No. 14, pp. 2133-2135.
L.S. Hung et al, Recent Progress of Molecular Organic Electroluminescent Materials and Devices, Materials Science and Engineering Reports 39, 2002, pp. 143-222.

A. Ioannidis et al, Hole and Electron Transport in Chloroaluminum Phtalocyanin Thin Films, The Journal of Physical Chemistry B, 1997, vol. 101, pp. 5100-5107.
Ping Lu et al, Synthesis of Octasubstituted Cyclooctatetraines and Their Use as Electron Transporters in Organic Light Emitting Diodes, Journal of the American Chemical Society, 2000, vol. 1222, pp. 7480-7486.
Hideyuki Murata et al, Efficient Organic Light-Emitting Diodes with Undoped Active Layers Based on Silole Derivatives, Applied Physics Letters, Jan. 14, 2002, vol. 80, No. 2, pp. 189-191.
Katsuyuki Naito et al, Molecular Design, Syntheses, and Physical Properties of Nonpolymeric Amorphous Dyes for Electron Transport, The Journal of Physical Chemistry A, 1997, vol. 101, pp. 2350-2357.
R. Pacios et al, Charge Separation in Polyflourene Composites with Internal Donor/Acceptor Heterojunctions, Synthetic Metals, 2002, vol. 127, pp. 261-265.
R. Pudzich et al, Synthesis and Characterization of New Oxadiazoleamine Based Spiro-Linked Fluorescence Dyes, Synthetic Metals, 2003, vol. 138, pp. 21-31.
M. Redecker et al, Electron Transport in Starburst Phenylquinoxalines, Applied Physics Letters, Jul. 5, 1999, vol. 75, No. 1, pp. 109-111.
Tobat P. I Saragi et al, Organic Phototransfer based on Intramolecular Charge Transfer in a Bifunctional Spiro Compound, Applied Physics Letters, Mar. 29, 2004, vol. 84, No. 13, pp. 2334-2336.
Yasuhiko Shirota, Organic Materials for Electronic and Optoelectronic Devices, Journal of Materials Chemistry, 2000, vol. 10, pp. 1-25.
Yahuhiko Shirota et al, A Novel Class fo Emitting Amorphous Molecular Materials as Bipolar Radical Formants: 2-{4-[Bis(4-methylphenyl)amino]phenyl}-5-(dimesitylboryl)thiophene and 2-{4-[Bis(9,9-dimethylfluorenyl) amino]phenyl}-5-(dimesitylboryl)thiophene, Journal of the American Chemical Society, 2000, vol. 122, pp. 11021-11022.
Zhi-Ming Zhang, Organic Light-Emitting Diodes Based on New Oxadiazole and Pyrazoline Derivatives, China Physics Letters, 2000, vol. 17, No. 6, pp. 454-456.
Raymond C. Kwong et al, High Operational Stability of Electrophosphorescent Devices, Applied Physics Letters, Jul. 1, 2002, vol. 81, No. 1, pp. 162-164.
Chihaya Adachi, et al, Nearly 100% Internal Phosphorescence Efficiency in an Organic Light Emitting Device, Journal of Applied Physics, Nov. 11, 2001, vol. 90, No. 10, pp. 5048-5051.
Adachi, C. et al., "Efficient electrophosphorescence using a doped ambipolar conductive molecular organic thin film," Organic Electronics 2, (2001), pp. 37-43.
Adachi, et al. "Electroluminescence in Organic Films with Three-Layer Structure," Japanese Journal of Applied Physics, 27, L269 (1988).
Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).
Ammermann, D. et al., "Photonic devices based on crystalline organic semiconductors for optoelectronic integrated circuits," Jps. J. Appl. Phys. Pt. 1 (1995) vol. 34, pp. 1293-1297.
Anderson, J.D. et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.
Baldo, et al. "Highly efficient phosphorescent emission from organic electroluminescent devices," Nature, vol. 395, Sep. 10, 1998, pp. 151-154.
Baldo, M. A. et al., "High efficiency fluorescent organic light-emitting devices using a phosphorescent sensitizer," Nature, (2000), vol. 403, pp. 750-753.
Baldo, M. A. et al., "Transient analysis of organic electrophosphorescence: I. Transient analysis of triplet energy transfer," Physical Review B, (2000), vol. 62:16, pp. 10958-10966.
Baldo, M. A., et al., "Transient analysis of organic electrophosphorescence II. Transient analysis of triplet-triplet annihilation," Physical Review B, (2000), vol. 62:16, pp. 10967-10977.

(56) References Cited

OTHER PUBLICATIONS

Baldo, M., et al., "Organic vapor phase deposition," Advanced Materials, 1998, 10, No. 18, pp. 1505-1514.
Bandyopadhyay, A, et al. "Large conductance switching and memory effects in organic molecules for data-storage applications," Appl. Phys. Lett. 82, 1215 (2003).
Bard, A. J., Faulkner, R.J., Electrochemical Methods: Fundamentals and Applications, Wiley, 2nd Ed., 2000 (Chapter 2).
Bard, A. J., Faulkner, R.J., Electrochemical Methods: Fundamentals and Applications, Wiley, 2nd Ed., 2000 (Chapter 6).
Bastard, G., "Wave mechanics applied to semiconductor heterostructures," The Editions of Physique, (1988) pp. 64-67.
Baumgartel, H. et al. "Intracluster Electron and Proton Transfer in Ionic Ortho-Xylene/Dimethylamine Aggregates," Ber Bunsenges. Phys. Chem. 101, 783-788 (1997) No. 5.
Baumgartel, H. et al., "Polarographische Untersuchungen zur Konformation von 1.2.3.4.5-pentaarylimidazoliumkationen," Ber. Bunsenges (1972) 76/2, 94-100.
Bernanose, Andre et al. "Sur un nouvea mode d'emission lumineuse chez certains composes organiques," J. de Chimie Physique, 1953, No. 1, pp. 64-68.
Birnstock, J. et al., "High Efficiency Top Emitting OLEDs on a-Si Active Matrix Backplanes with Large Aperture Ratio," OLED1: Panel, IDW '04, Dec. 8, 2004.
Blochwitz, J. "Organic Light-Emitting Diodes with Doped Charge Transport Layers" Dissertation: Technische Universitat Dresden (2001). http://deposit.ddb.de/cgi-bin/dokserv?idn=963580051&dok_var—d1&dok_ext—pdf&filename=963580051.pdf.
Blochwitz, J. et al., "Interface electronic structure of organic semiconductors with controlled doping levels," Org. Electronics 2, 97 (2001).
Blochwitz, J., et al., "Low voltage organic light emitting diodes featuring doped phthalocyanine as hole transport material," Applied Physics Letters, vol. 73, No. 6, Aug. 10, 1998, pp. 729-731.
Blochwitz, J., et al., "Non-polymeric OLEDs with a doped amorphous hole transport layer and operating voltages down to 3.2 V to achieve 100 cd/m$^2$," Synthetic Metals, (2002), vol. 127, pp. 169-173.
Bloom, C. J. et al., "Low work function reduced metal complexes as cathodes in organic electroluminescent devices," J. of Phyiscal Chemistry B, vol. 107, No. 13, pp. 2933-2938.
Carter, S. A. et al., "Enhanced luminance in polymer composite light emitting devices," Appl. Phys. Lett., vol. 71, pp. 1145-1147, Sep. 1997.
Colle, M. et al. "Switching and filamentary conduction in non-volatile organic memories," Organic Electronics, 7, 305-312 (Oct. 2006).
Connelly, N. G. et al., "Chemical Redox Agents for Organometallic Chemistry," Chem. Rev., 96, 877 (1996).
Cotton, F. et al., "Closed-shell molecules that ionize more readily than cesium," Science, vol. 298, No. 5600, pp. 1971-1974 (Dec. 6, 2002).
D'Andrade, B.W. et al., "Relationship between the ionization and oxidation potentials of molecular organic semiconductors," Organic Electronics 6, 2005, pp. 11-20.
D'Andrade, Brian W., "Operational stability of electrophosphorescent devices containing p and n doped transport layers," Applied Physics Letters, vol. 83, No. 19, Nov. 10, 2003, pp. 3858-3860.
D'Andrade, Brian W., et al., "Efficient organic electrophosphorescent white-light emitting device with a triple doped emissive layer," Advanced Materials, No. 7, 16, Apr. 5, 2004. pp. 624-628.
D'Andrade, Brian W., et al., "High-efficiency yellow double-doped organic light-emitting devices based on phosphorsensitized fluorescence," Appl. Phys. Lett., (2001), vol. 79:7, pp. 1045-1047.
Day et al. "The use of charge transfer interlayers to control hole injection in molecular organic light-emitting diodes," Thin Solid Films, 410 (2002) pp. 159-166.
Dodabalapur et al., "Organic transistors: Two-dimensional transport and improved electrical characteristics," Science, vol. 268, p. 270 (1995).

Endo, Jun et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.
Feng, X.D. et al. "Ohmic Cathode for Low-Voltage Organic Light-Emitting Diodes," App. Phys. Lett., vol. 86, Article 143511 (Apr. 1, 2005): pp. 1-3.
Gao, W. et al., "Effect of electrical doping on molecular level alignment at organic-organic heterojunctions," Applied Physics Letters, vol. 82, No. 26, Jun. 30, 2003, pp. 4815-4817.
Gu, G. et al., "Transparent organic light emitting devices," Applied Physics Letters, (1996), vol. 68:19, pp. 2606-2608.
Gu, G., et al. "Transparent stacked organic light emitting devices. I. Design principles and transparent compound electrodes," Journal of Applied Physics, 1999, vol. 86, No. 8, pp. 4067-4075.
Gufeng, et al., "Very high-efficiency and low voltage phosphorescent organic light-emitting diodes based on a p-i-n. junction," Journal of Applied Physics, vol. 95, No. 10, pp. 5773-5777 (May 15, 2004).
Hack, M. et al. "Status and Opportunities for High Efficiency OLED Displays on Flexible Substrates," Mater. Res. Soc. Symp. Proc., vol. 870E, Article H3.1, Symposium H Giant Area Electronics on Nonconventional Substrates (Mar. 28-Apr. 1, 2005): pp. 1-10.
Harada, K. et al. "Ionized impurity scattering in n-doped C60 thin films," Applied Physics Letters, 91, 092118 (2007).
Harada, K. et al. "Organic Homojunction Diodes with a High Built-in Potential: Interpretation of the Current-Voltage Characteristics by a Generalized Einstein Relation," Phys. Rev. Lett. 94, 036601 (2005).
Higgins, R.W.T. et al. "Emeraldine base polyaniline as an alternative to poly(3,4-ethylenedioxythiophene) as a hole-transporting layer," Advanced Functional Materials, 11, 407-412 (Dec. 1, 2001).
Hong, Il-Hwa et al. "Effective hole injection of organic light-emitting diodes by introducing buckminsterfullerene on the indium tin oxide anode," Applied Physics Letters, 2005, 87, 063502-1.
Huang, Jingsong et al., "Effect of well number on organic multiple-quantum-well electroluminescent device characteristics," Applied Physics Letters, (1998), vol. 73:23, pp. 3348-3350.
Huang, Jingsong et al., "Influence of the thickness and doping of the emission layer on the performance of organic light-emitting diodes with PiN structures," Journal of Applied Physics, (2003), vol. 93:2, pp. 838-844.
Huang, Jingsong et al., "Low operating voltage and high-efficiency organic multilayer electroluminescent devices with p-type doped hole injection layer," Jps. J. Appl. Phys., (2001), vol. 40, pp. 6630-6633.
Huang, Jingsong et al., "Low-voltage organic electroluminescent devices using pin structures," Applied Physics Letters, vol. 80, No. 1, Jan. 7, 2002, pp. 139-141.
Hughes, et al. "Electron transporting materials for organic electroluminescent and electrophosphorescent devices," Journal of Materials Chemistry (2005), vol. 15, pp. 94-107.
Ishii, M. et al., "Improvement of organic electroluminescent device performance by in situ plasma treatment of indium-tin-oxide surface," J. Lumin., 1165 (2000).
Kido, Junji; "Recent progress in organic light-emitting devices," Proceedings of the 1st International Display Manufacturing Conference IDMC 2000, Seoul Korea, Sep. 5, 2000, pp. 399-400.
Koch, N. et al., "Optimized hole Injection with Strong Acceptors at Organized-Metal Interfaces," Phys. Rev. Lett., vol. 95, pp. 237601-237603, Nov. 30, 2005.
Krieger et al. "Molecular analogue memory cell based on electrical switching and memory in molecular thin films," Synthetic Metals, 122, 199-202 (May 2001).
Kwong, R.C. et al. "Current Status of Electrophosphorescent Device Stability," Org. Electr., vol. 4 (2003): pp. 155-164.
Lambert, M.A., "Volume-controlled current injection in insulators," Rep. Progr. Phys. 27, 329 (1964).
Lee et al. "The Effect of C60 doping on the device performance of organic light-emitting diodes," Applied Physics Letters, 86 (2005) 063514 (3 pages).
Lee, et al. "Effects of hydroxyl groups in polymeric dielectrics on organic transistor performance," Applied Physics Letters, 88, 162109 (2006).

(56) References Cited

OTHER PUBLICATIONS

Liping, Ma et al. "Nonvolatile electrical bistability of organic/metal-nanocluster/organic system," Appl. Phys. Lett. 82, 1419-1421 (Mar. 3, 2003).
Lupton, J. M. et al., "Bragg scattering from periodically microstructured light emitting diodes," Appl. Phys. Lett., vol. 77, pp. 3340-3342, Nov. 2000.
Ma, E.Y., et al. "Thin Film Transistors for Foldable Displays," IEEE Technical Digest, Electron Devices Meeting, 1997. IEDM '97. (Dec. 7-10, 1997): pp. 535-538.
Madigan, C.F. "Improvement of Output coupling efficiency of organic light emitting diodes by backside substrate modification," Appl. Phys. Lett., vol. 76, pp. 1650-1652, Mar. 2000.
Maennig, B. et al. "Controlled p-type doping of polycrystalline and amorphous organic layers: Self-consistent description of conductivity and field-effect mobility by a microscopic percolation model," Physical Review B, 64, 195208 (2001).
Matsumura, M. et al., "Analysis of current-voltage characteristics of organic light emitting diodes having a LiF/Al cathode and an Al-hydroxyquinoline/diamine junction," Applied Physics Letters, 2872 (1998).
Mattoussi, H. et al., "Photoluminescence quantum yield of pure and molecularly doped organic solid films," Journal of Applied Physics, (1999), vol. 86:5, p. 2642.
Miller, L.L. et al., "A simple comprehensive correlation of organic oxidation and ionization potentials," J. Org. Chem., 1972, vol. 37, No. 6, pp. 916-918.
Mori, T. et al., "Electroluminescence of organic light emitting diodes with alternately deposited dye-doped aluminum quinoline and diamine derivative," Journal of Physics D—Applied Physics, (1999), vol. 32:11, pp. 1198-1203.
Ohmori, Yutaka et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.
Ohmori, Yutaka et al., "Observation of spectral narrowing and emission energy shift in organic electroluminescent diode utilizing 8-hydroxyquinoline aluminum/aromatic diamine multilayer structure," Applied Physics Letters, (1993), vol. 63:14, pp. 1871-1873.
Parker, "On the Problem of Assigning Values to Energy Changes of Electrode Reactions," Journal of the American Chemical Society, 96:17, Aug. 21, 1974, pp. 5656-5661.
Pfeiffer et al., "Controlled p-doping of pigment layers by cosublimation: Basic mechanisms and implications for their use in organic photovoltaic cells," Solar Energy Materials and Solar Cells, vol. 63, pp. 83-99, Jun. 1, 2000.
Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.
Pfeiffer, M. et al., "Controlled doping of phthalocyanine layers by cosublimation with acceptor molecules: A systematic Seebeck and conductivity study," Applied Physics Letters, vol. 73, No. 22 Nov. 20, 1998, pp. 3202-3204.
Pfeiffer, Martin et al., "Electrophosphorescent p-i-n. organic light-emitting devices for very-high-efficiency flat-panel displays," Advanced Materials, (2002), vol. 14:22, Nov. 18, 2002, pp. 1633-1636.
Pope, et al., "Single positive or negative carriers in organic crystals," Electronic Processes in Organic Crystals and Polymers, Oxford Science Publications, Oxford University Press, (1999), pp. 202-207.
Potember, R.S. et al. "Electrical switching and memory phenomena in Cu-TCNQ thin films," Appl. Phys. Lett. 34, 405 (1979).
R. Schlaf et al., "Homo/Lumo Alignment at PTCDA/ZnPc and PTCDA/ClInPc Heterointerfaces Determined by Combined UPS and XPS Measurements," J. Phys. Chem. B 1999, 103, pp. 2984-2992.

Sakamoto, Gosuke et al., "Significant improvement of device durability in organic light-emitting diodes by doping both hole transport and emitter layers with rubrene molecules," Applied Physics Letters, (1999), vol. 75:6, pp. 766-768.
Sato, N., et al., "Polarization Energies of Organic Solids Determined by Ultraviolet Photoelectron Spectroscopy," J. Chem. Soc. Faraday Trans. 2, 77, 1621 (1981).
Schnitzer, J., "30% External Quantum Efficiency from Surface Textured, Thin-film Light emitting diodes," Applied Phys. Lett., vol. 63, pp. 2174-2176, Oct. 1993.
Shinar, J. "Organic Light-Emitting Devices—A Survey" (Adachi et al. "Design concept of molecular materials for high-performance OLED" p. 43)) AIP-Press, Springer, New York 2004.
Signerski, et al. "The photovoltaic effect in a heterojunction of molybdenyl phthalocyanine and perylene dye," Journal of Non-Crystalline Solids, North-Holland Physics Publishing; vol. 352, No. 40-41, Nov. 1, 2006, pp. 4319-4324.
Tang, C. W., et al., "Electroluminescence of doped organic thin films," Journal of Applied Physics, (1989), vol. 65:9, pp. 3610-3616.
Tang, C.W. et al., "Organic electroluminescent diodes," Applied Physics Letters, vol. 51, No. 12, Sep. 21, 1987, pp. 913-915.
Tang, T.B. et al., "Ionization thresholds of merocyanine dyes in the solid state," Journal of Applied Physics, vol. 59, (1), Jan. 1986, pp. 5-10.
Tsiper, E.V. and Soos, Z.G.; "Charge redistribution and polarization energy of organic molecular crystals," Physical Review B; vol. 64; 195124-1.
Tsutsui, T. et al., "High quantum efficiency in organic light emitting devices with iridium-complex as a triplet emissive center," Jps. Journal of Applied Physics, part 2 letters, (1999), vol. 38:12B, pp. L1502-L1504.
Tsuzuki, T. et al. "The effect of fullerene doping on photoelectric conversion using titanyl phthalocyanine and a perylene pigment," Solar Energy Materials and Solar Cells, Elsevier Science Publishers, Amsterdam, vol. 61, No. 1, Feb. 15, 2000; pp. 1-8.
Vissenberg, M.C. et al. "Theory of the field-effect mobility in amorphous organic transistors," Physical Review B, 27, 12964 (1998).
Volkel, A. R. et al. "Carrier transport and density of state distributions in pentacene transistors," Physical Review B, 66, 195336 (2002).
Wang, S.D. et al. "Bottom contact ambipolar organic thin film transistor and organic inverter based on $C_{60}$/pentacene heterostructure," Organic Electronics, 7 (2006) pp. 457-464.
Werner, A. G. et al., "Pyronin B as a donor for n-type doping of organic thin films," Applied Physics Letters, vol. 82, No. 25, Jun. 23, 2003, pp. 4495-4497.
Werner, A.G. et al., "n-Type Doping of Organic Thin Films Using Cationic Dyes," Adv. Funct. Mater., vol. 14, No. 3 (Mar. 2004): pp. 255-260.
Wu, C.C. et al. "Integration of Organic LEDs and Amorphous Si TFTs Onto Flexible and Lightweight Metal Foil Substrates," IEEE Electron Device Letters, vol. 18, No. 12 (Dec. 1997): pp. 609-612.
Yamamoria, A et al., "Doped Organic Light Emitting Diodes having a 650-nm Thick Hole Transport Layer," Appl. Phys. Lett. vol. 72, No. 17 (Apr. 27, 1998); pp. 2147-2149.
Yamasaki, T. et al., "Organic Light emitting device with an ordered monolayer of silica microspheres as a scattering medium," Appl. Phys. Lett., vol. 76, pp. 1243-1245, Mar. 2000.
Yang, et al., 2003, "Self-assembly and Magnetic Properties of Cobalt Nanoparticles," Appl. Phys. Lett., 82(26): 4729.
Yang, Y. et al. "Organic electrical bistable devices and rewritable memory cells," Appl. Phys. Lett. 80, 2997 (2002).
Yao, Fu et al., "Quantum-chemical predictions of Absolute standard redox potentials of diverse organic molecules and free radicals in acetonitrile," J. Am. Chem. Soc. 2005, 127, pp. 7227-7234.
Yuan et al. "Fullerene-doped hole transport molecular films for organic light-emitting diodes," Applied Physics Letters, 86 (2005) 143509 (3 pages).
Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.

(56) References Cited

OTHER PUBLICATIONS

Zhou, X. et al., "Low-voltage inverted transparent vacuum deposited organic light-emitting diodes using electrical doping," Applied Physics Letters, vol. 81, No. 2, Jul. 29, 2002, pp. 922-924.

Disclosure Under 37 C.F.R. 1.56 for U.S. Appl. No. 11/573,617 Submitted Herewith.

Connelly, Neil G., New Linear Chain Mixed Metal Compounds: Complex Salts of [Pt(CNMe)4]2+, J. Chem. Soc., (1992), pp. 1565-1567, Bristol, UK.

Connelly, Neil G., Linear Chain Metal Compounds: [M(mnt)(CNMe)2][M = Ni, Pd, Pt; mnt = 1,2-S2C2(CN)2], J. Chem. Soc. (1992), pp. 1568-1571, Bristol, UK.

Gritzner, G., Recommendations of Reporting Electrode and Potentials in Nonaqueous Solvents, Pure & Appl. Chem., (1984), pp. 461-466, vol. 56, No. 4, Linz, Austria.

Miller, Joel Steven, Preparation and Reactions of Tetrakis (meth isocyanide) Complexes of Divalent Nickel, Palladium, and Platinum, Inorganic Chemistry, (1972), pp. 2069-2074, vol. 11, No. 9, Davis, California.

Japanese Patent Office Action in corresponding Japanese Application No. JP 2007-525155; mailed Sep. 14, 2010.

He, Gufeng et al. "High efficiency and low voltage p-i-n electrophosphorescent OLEDs with double-doping emission layers," Organic Optoelectronics and Photonics, Proceedings of SPIE vol. 5464, p. 26-33.

Korean Patent Office Action in corresponding Korean Application No. 10-2007-7003457; mailed Sep. 7, 2010.

Adamovich, V. et al. "New charge-carrier blocking materials for high efficiency OLEDs," Organic Electronics, 2003, vol. 4, pp. 77-87.

Leclerc, N. et al. "6-(Arylvinylene)-3-bromopyridine derivatives as lego building blocks for liquid crystal, nonlinear optical, and blue light emitting chromophores," Chem. Mater., 2005, vol. 17, pp. 502-513.

van Gemmern, P. "Organic Devices for Solid State Lighting Technology and Processing," Dissertation, Aug. 11, 2008.

Japanese Office Action mailed May 10, 2011 in JP Application No. 2007-525155 (7 pages).

R. Enderlein and N. Horing, "Chapter 3: Electronic Structure of Semiconductor Crystals with Perturbations," Fundamentals of Semicondcutor Physics and Devices, p. 396, World Scientific Publishing Co. Pte. Ltd., 1997.

\* cited by examiner

LAYER ASSEMBLY FOR A LIGHT-EMITTING COMPONENT

CROSS-REFERENCE TO RELATED APPLICATION

This is a submission pursuant to 35 U.S.C. 154(d)(4) to enter the national stage under 35 U.S.C. 371 for PCT/DE2005/001076 filed Jun. 16, 2005. Priority is claimed under 35 U.S.C. 119(a) and 35 U.S.C. 365(b) to German Patent Application No. 10 2004 039594.2 filed Aug. 13, 2004 and European Patent Application 04019276.7 filed Aug. 13, 2004. The subject matters of PCT/DE2005/001076, German Patent Application No. 10 2004 039594.2 and European Patent Application 04019276.7 are hereby expressly incorporated herein by reference.

The invention relates to a layer assembly for a light-emitting component, in particular an organic phosphorescent light-emitting diode (OLED).

PRIOR ART

A component having an assembly of organic layers is described, for example, in the document WO 03/100880.

Typical realizations of such components, as have been reported, for example, by Baldo et al. (Appl. Phys. Lett., 75 (1), 4-6 (1999) or Ikai et al. (Appl. Phys. Lett., 79 (2), 156-158 (2001)), are based on a simple light-emitting layer (EML) which comprises a mixture of a matrix material and a phosphorescence dopant. If this has, as described in the studies of Baldo et al. (EML comprising CBP (4,4'-N,N'-dicarbazolyl-biphenyl or 4,4'-bis(carbazol-9-ylbiphenyl)) doped with $Ir(ppy)_3$ (fac tris(2-phenylpyridine)iridium)) and Ikai et al. (EML comprising TCTA (4,4',4''-tris(N-carbazolyl)triphenylamine) doped with $Ir(ppy)_3$) predominantly hole-transporting character, a hole-blocking layer (HBL) composed of a material having a very high ionization energy, namely BCP (bathocuproin, 2,9-dimethyl-4,7-diphenyl-1,10-phenanthroline) in the case of Baldo et al. and a perfluorinated starburst material in the case of Ikai et al., is required between the emission layer and an electron transport layer or the cathode.

On the other hand, if the EML has predominantly electron-conducting character, as in a realization of Adachi et al. (Appl. Phys., 90 (10), 5048-5051 (2001)) where the EML comprises an electron transport material TAZ (a derivative of 1,2,4-triazole, for example 3-(4-biphenylyl)-4-phenyl-5-tert-butylphenyl-1,2,4-triazole), doped with an Ir complex as emitter dopant, an electron-blocking layer (EBL) composed of a material having a very low electron affinity is required, for which Adachi et al. use 4,4'-bis[N,N'-(3-tolyl)amino]-3,3'-dimethylbiphenyl (HM-TPD). However, this results in the problem that, especially in the case of high luminances, accumulation of holes/electrons at the hole-/electron-blocking layer occurs, which leads to a drop in the efficiency with increased luminance.

A further problem is that the charge carrier accumulation accelerates degradation of the OLED. In addition, good hole-blocking materials are often electrochemically unstable. This is true, for example, for the use of the widespread materials bathocuproin (BCP), bathophenanthroline (BPhen) and 2,2',2''-(1,3,5-benzenetriyl)tris[1-phenyl-1H-benzimidazole (TPBI) as hole-blocking materials (cf. Kwong et al., Appl. Phys. Lett., 81, 162 (2002)).

In the document WO 03/100880, ambipolar light-emitting layers (EML) EML1 and EML2 are used as follows in a layer assembly for an organic phosphorescent light-emitting diode: anode=ITO/hole-transporting layer (HTL) 1=F4-TCNQ doped with MeO-TPD/HTL 2=spiro-TAD/EML1=TCTA:Ir$(ppy)_3$/EML2=BPhen:Ir$(ppy)_3$/electron-transporting layer (ETL) ETL2=BPhen/ETL1=BPhen:Cs-doped/cathode=Al. The barrier for electron injection from EML2 into EML1 is in this case about 0.5 eV.

An organic phosphorescent light-emitting diode is also disclosed in the document WO 02/071813 A1. In the known light-emitting diode, a light-emitting region having two emission layers with hole transporters/electron transporters which are each doped with the same triplet emitter dopant.

The known components suffer from the problem that the energy barrier between the hole-transporting material and the electron-transporting material is high, so that an accumulation of charge carriers occurs in the light-emitting region, which leads to a high probability of the quenching of excitons by charge carriers (triplet-polaron quenching). In addition, the generation of excitons occurs essentially at the interface between the hole-transporting part and the electron-transporting part of the component. For this reason, a high local triplet exciton density occurs in this region, which results in a high probability of triplet-triplet annihilation. The triplet-polaron quenching and the triplet-triplet annihilation lead to a drop in the quantum efficiency at relatively high current densities.

THE INVENTION

It is an object of the invention to provide a layer assembly for a light-emitting component, in particular a phosphorescent organic light-emitting diode, having improved light-emitting properties, in particular an improved quantum yield of the phosphorescence at high luminances, and an increased life.

This object is achieved according to the invention by a layer assembly for a light-emitting component according to the independent Claim 1. Advantageous embodiments of the invention are subject-matter of dependent subordinate claims.

The invention is based on the idea of providing at least two ambipolar layers of which one preferentially transports electrons and one other preferentially transports holes, in the light-emitting region of the layer assembly, also referred to as emission zone.

Preferential transport of one type of charge carriers, namely electrons or holes, occurs in a layer of the light-emitting component if the charge carrier mobility for this type of charge carriers in the layer is greater than the charge carrier mobility for the other type of charge carriers and/or if the injection barrier for this type of charge carriers is lower than the injection barrier for the other type of charge carriers.

A heterotransition is referred to as a staggered heterotransition, also referred to as a heterotransition of the "staggered type II" between an organic material (M1) and another organic material (M2) when the material which preferentially transports holes (M1) has both a lower ionization energy and a lower electron affinity than the other material which preferentially transports electrons (M2), which means that both the highest occupied orbital (HOMO) and the lowest unoccupied orbital (LUMO) for the material (M1) are closer to the vacuum level than is the case for the other material (M2). This results in an energy barrier for injection of holes from the material (M1) into the other material (M2) and an energy barrier for injection of electrons from the other material (M2) into the material (M1).

A layer based on an organic material is an ambipolar layer for the purposes of the present application when the electron mobility and the hole mobility in the layer differ by less than about two orders of magnitude and the organic material of the ambipolar layer is reversibly reducible and oxidizable, which is based on electrochemical stability of the radical anion and of the radical cation of the organic material.

The ambipolar property can preferably be made more pronounced by a hole transport level (HOMO—"highest occupied molecular orbital") being not more than about 0.4 eV, preferably not more than about 0.3 eV, below the hole transport level of customary hole transport materials in order to make hole injection possible. A customary hole transport material is, for example, N,N'-di(naphthalen-2-yl)-N,N'-diphenyl-benzidine (NPD). A HOMO energy which is from about 5.5 eV to about 5.7 eV below the vacuum level is reported for the reference material NPD.

In addition to or as an alternative to the abovementioned property involving the HOMO energy, the ambipolar property is produced by the electron transport level of the organic material of the ambipolar layer being not more than about 0.4 eV, preferably not more than about 0.3 eV, above the electron transport level of customary electron transport materials, for example $Alq_3$. This criterion can be checked by means of methods of estimating the LUMO energy (LUMO—"lowest unoccupied molecular orbital"), which are known per se to those skilled in the art. These include, in particular:

a) Measurement of the ionization energy (IP), for example by means of photoelectron spectroscopy, and the optical absorption edge $E_g^{opt}$ and estimation of the LUMO energy in a vacuum as $IP-E_g^{opt}$. In the case of $Alq_3$, LUMO energy levels which are from about 2.9 eV to about 3.1 eV below the vacuum level are obtained.
b) Electrochemical determination of the potential for the first reduction. Here, the potential of $Alq_3$ is found to be −2.3 V relative to ferrocene/ferrocene$^+$, which corresponds to an electron affinity of about 2.5 eV.
c) Determination of the LUMO energy level of the organic material used for the ambipolar layer in the case of $Alq_3$ by examination of the barrier to electron transport across the interface to $Alq_3$.

An organic layer having ambipolar properties can be obtained, for example, as follows:

i) A unipolar organic matrix material is used together with an emitter material having complementary transport properties. For example, the emitter material is hole-transporting when the matrix material is electron-transporting, or vice versa. In this embodiment, the ratio of hole mobility and electron mobility can be set by means of the dopant concentration in the emitter material. A matrix composed of a unipolar hole-transporting matrix material is referred to as a "hole-only" matrix, while an "electron-only" matrix is a matrix composed of a unipolar electron-transporting matrix material.
ii) An ambipolar matrix material can be used.
iii) In a further embodiment, a mixture of two matrix materials and an emitter material is used, with one of the matrix materials being hole-transporting and the other matrix material being electron-transporting. The ratio of hole mobility and electron mobility can be set by means of the mixing ratios. The molecular mixing ratios are in the range from 1:10 to 10:1.

The invention has the advantage over the prior art that the assembly composed of a plurality of layers in the light-emitting region has a self-balancing character in respect of the required balance of electron injection and hole injection. The accumulation of charge carriers at interfaces is avoided, both at the interface to the adjoining transport or blocking layers, which is, in particular, an advantage over the known light-emitting component of Adachi et al. (Appl. Phys., 90 (10), 5048-5051 (2001)), and also at the internal interface between the layers in the light-emitting region, which results in an advantage over, in particular, the prior art from the document WO 02/071813 A1. As a result, a very wide overlap zone of the injected electron and hole distributions in the light-emitting region of the layer assembly and thus a wide generation zone for excited states (excitons) are formed. Both degradation processes owing to high local charge carrier densities and efficiency-reducing quenching processes between charge carriers and excitons and between excitons are minimized in this way.

It is possible for the light-emitting region to have more than two light-emitting layers, as is described in the document WO 03/100880, whose contents are hereby incorporated by reference into the present patent application.

The triplet emitter dopants for the light-emitting layers can be identical or different.

The charge carrier transport layers and/or the hole- or electron-blocking layer can be omitted on the electron side and/or the hole side, so that the light-emitting layers directly adjoin the contacts (anode, cathode) or the (doped) charge carrier transport layers in the light-emitting region of the layer assembly. This is made possible by the self-balancing character of the layer system in the emission zone, since otherwise excitons would be quenched at the metal contact or on contact with dopants or the charge carriers could flow transversely through the OLED and recombine without emitting radiation at the other contact or at the doped transport layer.

EXAMPLES

The invention is illustrated below with the aid of examples with reference to figures of the drawing. Here;

Figure 5:
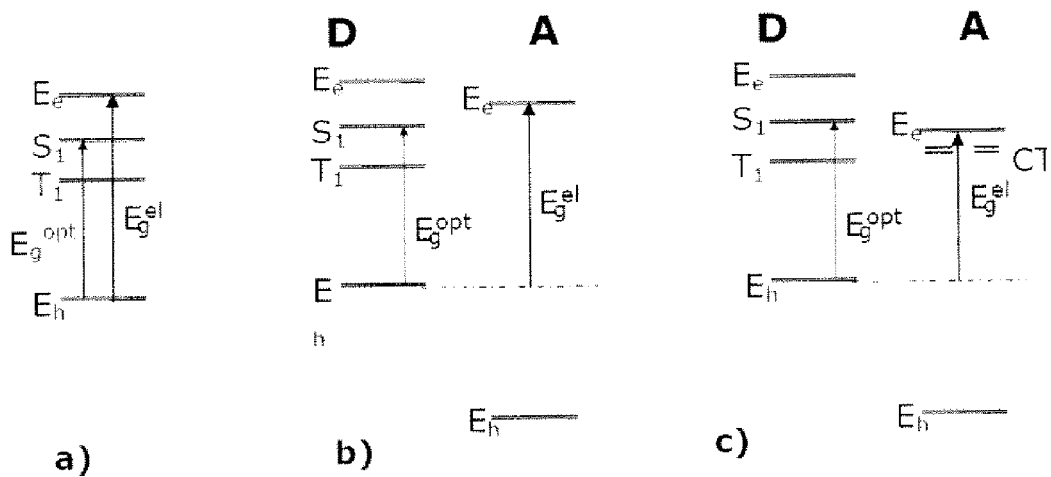
Figure 6:
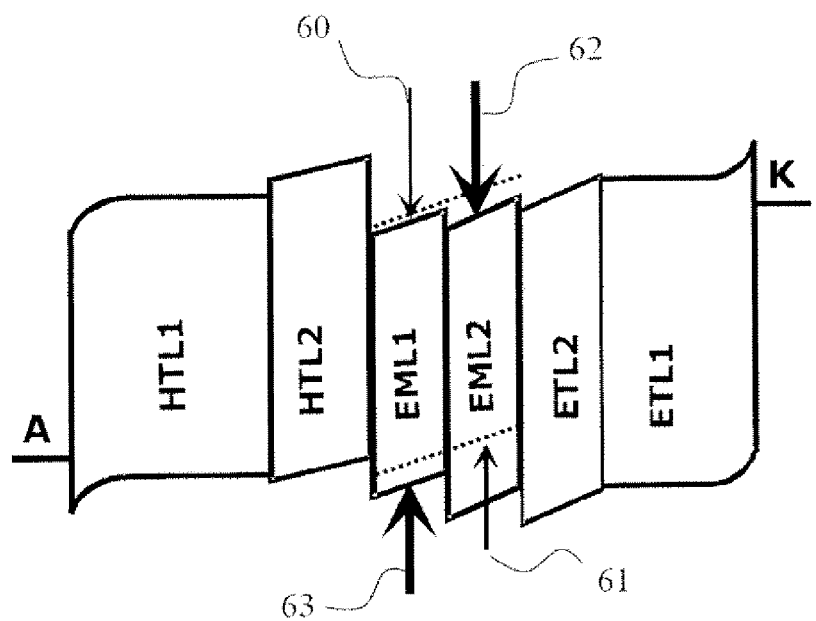

FIG. 5 schematically shows the energy levels for a) a simple material having a contiguous π electron system, for b) subunits D (donor subunit) and A (acceptor subunit) of a DAD in which at least one of the energy differences between HOMO levels or LUMO levels of the subunits is so small that the lowest singlet excited state is a Frenkel exciton on one of the subunits, and for c) subunits D and A of a DAD in which at least one of the energy differences between HOMO levels or LUMO levels of the subunits is so large that the lowest singlet excited state is a charge transfer exciton consisting of an electron on the subunit A and a hole on the subunit D;

FIG. 6 schematically shows an energy level diagram for an example in which a material (M1) for one of the layers EML1 in the emission zone comprises a bipolar, single-component material and another material (M2) for another of the layers EML2 in the emission zone comprises an electron-only matrix and a hole-transporting emitter dopant; the broken lines represent the energy levels of the emitter dopants.

Figure 7:
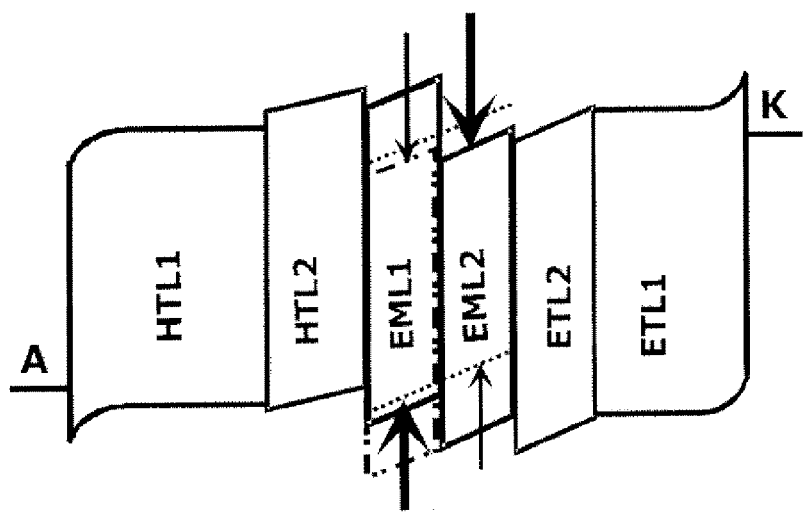
Figure 8:
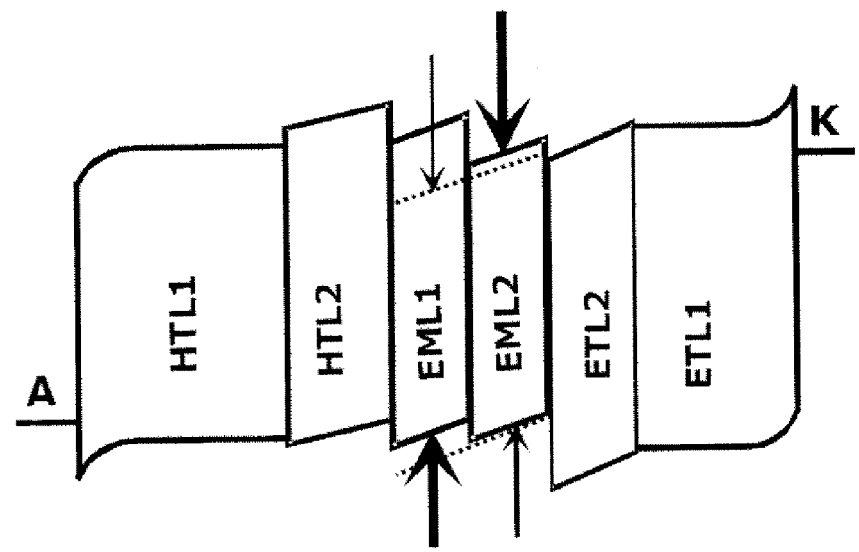
Figure 9:
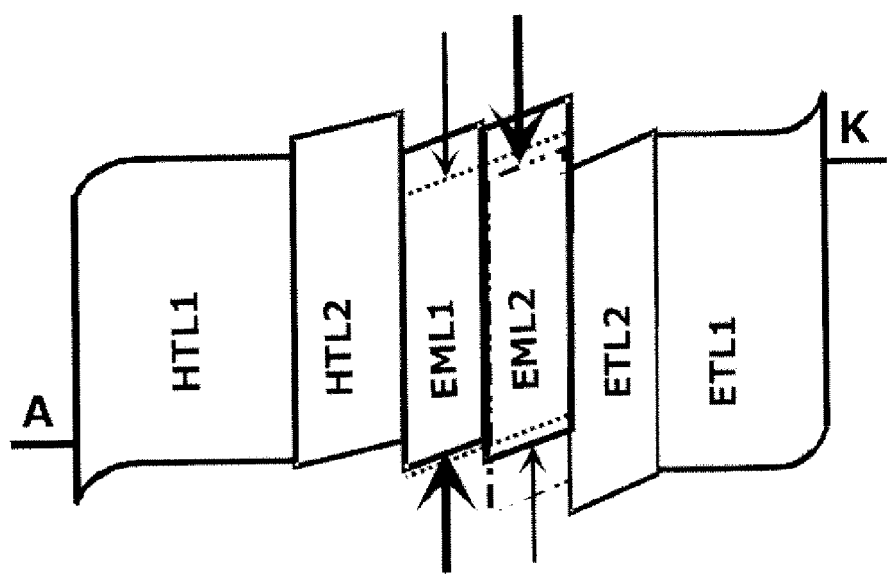
Figure 10:
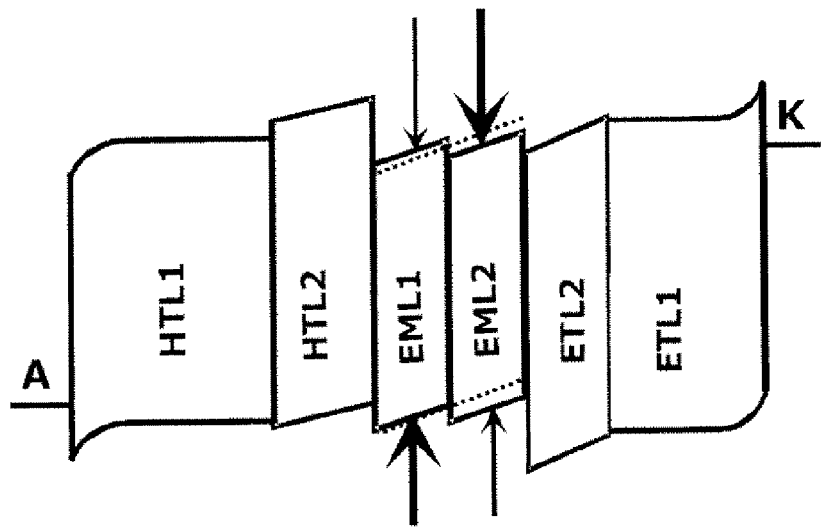
Figure 11:
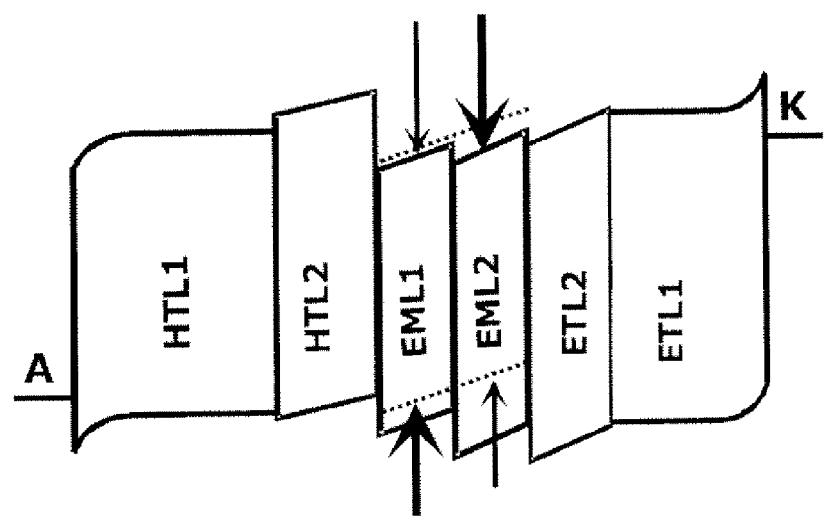
Figure 12:
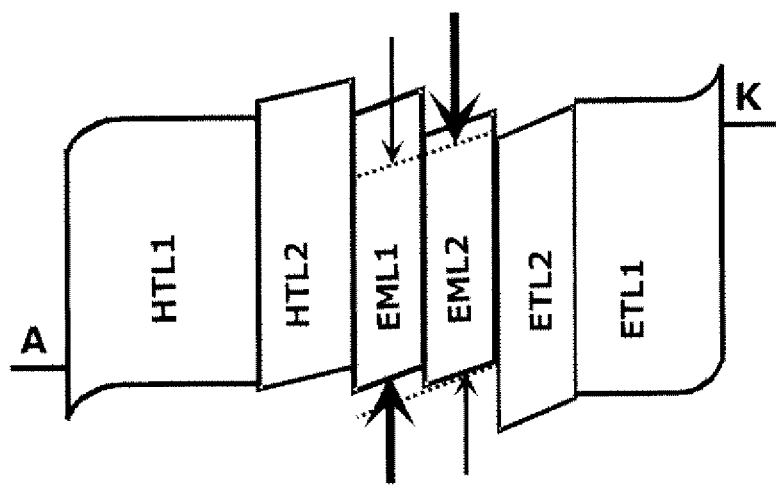

FIG. 7 schematically shows an energy level diagram for an example in which the material (M1) for one of the layers (EML1) in the emission zone comprises a mixture of a hole-transporting material, an electron-transporting material and a triplet emitter dopant and the other material (M2) for another of the layers EML2 in the emission zone comprises an electron-only matrix;

FIG. 8 schematically shows an energy level diagram for an example in which the material (M1) for one of the layers EML1 in the emission zone comprises a hole-only matrix, in which electron transport can occur by hopping between dopant states, and the other material (M2) for another of the layers EML2 in the emission zone comprises an ambipolar, single-component material;

FIG. 9 schematically shows an energy level diagram for an example in which the material (M1) for one of the layers EML1 in the emission zone comprises a hole-only matrix, in which electron transport can occur by hopping between dopant states, and the other material (M2) for another of the layers EML2 in the emission zone comprises a mixture of a hole-transporting material, an electron-transporting material and a triplet emitter dopant;

FIG. 10 schematically shows an energy level diagram for an example in which the material (M1) for one of the layers EML1 in the emission zone and the other material (M2) for another of the layers EML2 in the emission zone are each composed of a single-component, ambipolar material or a mixture comprising a hole-transporting material and an electron-transporting material;

FIG. 11 schematically shows an energy level diagram for an example in which hole transport in the material (M1) for the layer EML1 in the emission zone and the other material (M2) for the layer EML2 in the emission zone takes place by hopping between states of the triplet emitter dopant (the greater hole mobility in M1 compared to M2 is here due to the smaller distance in energy terms to the hole transport level of the matrix, so that tunnelling between dopant states in M1 is made easier); and FIG. 12 schematically shows an energy level diagram for an example in which electron transport in the material (M1) for the layer EML1 in the emission zone and the other material (M2) for the layer EML2 in the emission zone takes place by hopping between states of the triplet emitter dopant (the greater electron mobility in M2 compared to M1 is here due to the smaller distance in energy terms to the electron transport level of the matrix, so that tunnelling between dopant states in M2 is made easier).

In the following description of examples, the following abbreviations are used: HTL—hole-transporting layer, ETL—electron-transporting layer, EML—layer in the light-emitting region, EBL—electron-blocking layer and HBL—hole-blocking layer.

Example 1

In a first example, the following layer assembly is provided for a light-emitting component:
Anode=ITO/
HTL1=F4-TCNQ (tetrafluorotetracyanoquinodimethane) doped into N,N,N',N'-tetrakis(4-methoxyphenyl)benzidine (MeO-TPD) at a mixing ratio of from 0.1 mol % to 10 mol % and a layer thickness of from about 30 nm to about 500 nm, preferably from about 50 nm to about 200 nm/
HTL2=2,2',7,7'-tetrakis(N,N-diphenylamino)-9,9'-spirobifluorene (spiro-TAD) having a layer thickness of from about 1 nm to about 30 nm, preferably from 3 nm to 15 nm, with HTL2 preferably being thinner than HTL1/
EML1=TCTA:Ir(ppy)$_3$ having a concentration of Ir(ppy)$_3$ of from about 1 mol % to about 50 mol %, preferably from about 3 to about 30 mol %, and a layer thickness of from about 2 nm to about 30 nm, preferably from about 3 nm to about 15 nm/
EML2=TPBI:Ir(ppy)$_3$ having a concentration of Ir(ppy)$_3$ of from about 1 mol % to about 50 mol %, preferably from about 3 to about 30 mol %, and a layer thickness of from about 2 nm to about 30 nm, preferably from about 3 nm to about 15 nm/
ETL2=bis(2-methyl-8-quinolinolato)-4-(phenylphenolato)aluminium(III) (BAlq$_2$) having a layer thickness of from about 1 nm to about 30 nm, preferably from about 3 nm to about 15 nm, with ETL2 preferably being thinner than ETL1. Comparable characteristics are obtained using BPhen instead of BAlq$_2$ as ETL2.
ETL1=BPhen:Cs-doped with a Cs concentration of from about 0.1 mol % to a molar ratio of 1:1 and a layer thickness of from about 30 nm to about 500 nm, preferably from about 50 nm to about 200 nm/
cathode=Al.

Electron transport in EML1 can optionally be aided by this layer being made up of a mixture of the three components TCTA, TPBI and Ir(ppy)$_3$, for example at a mixing ratio of 46%/46%/8%. The barrier to injection of electrons from EML2 into EML1 is in this case less than about 0.3 eV. The barrier to injection of holes from EML1 into EML2 is about 0 eV, since hole transport in EML1 and EML2 takes place as hopping to Ir(ppy)$_3$, or can even be negative when a hole goes from a TCTA state to an Ir(ppy)$_3$ state in EML2. The incorporation of the redox dopants, for example acceptors such as F4-TCNQ or donors such as Cs, and the emitter dopants, namely Ir(ppy)$_3$ in the example, can, for example, be carried out by means of mixing vaporization from two separately controllable thermal sublimation sources under reduced pressure or by means of other suitable methods such as successive application of the materials, for example by means of vaporization under reduced pressure, and subsequent diffusion into one another, if appropriate aided by a specific temperature-time profile.

The ambipolarity of EML2 is, in the first example, achieved by means of the hole transport property of Ir(ppy)$_3$ in the electron transport materials TPBI and BPhen. A little TCTA can optionally be mixed into the EML2 in order to aid hole transport, but the TCTA concentration in EML2 should always be less than that in EML1.

Example 2

A second example has a structure like Example 1 above, except that ETL2 is made up of Alq$_3$:anode=ITO/HTL1=F4-TCNQ-doped MeO-TPD/HTL2=spiro-TAD/EML1=TCTA: Ir(ppy)$_3$/EML2=TPBI:Ir(ppy)$_3$/ETL2=Alq$_3$/ETL1=BPhen: Cs-doped/cathode=Al. This example demonstrates the self-balancing aspect of the structure which makes it possible, if desired, to dispense with hole- and/or electron-blocking layers entirely. Alq$_3$ has no hole-blocking action, but is more stable than the typical hole-blocking materials such as BCP. In this example, Alq$_3$ aids electron injection from BPhen:Cs into EML2.

Example 3

In a third example, the structure is simplified by neither an electron-blocking layer nor a hole-blocking layer being provided, but in this case it is possible to omit only one of the blocking layers:
anode=ITO/HTL1=F4-TCNQ-doped MeO-TPD/ EML1=TCTA:Ir(ppy)$_3$/EML2=TPBI:Ir(ppy)$_3$/ ETL1=BPhen:Cs-doped/cathode=Al.

Example 4

An example which constitutes a modification of Example 3 has the following structure: anode=ITO/HTL1=F4-TCNQ-doped MeO-TPD/HTL2=spiro-TAD/EML1=TCTA: Ir(ppy)$_3$/EML2=TPBI:Ir(ppy)$_3$/ETL1=BPhen:Cs-doped/cathode=Al.

Figure 1:
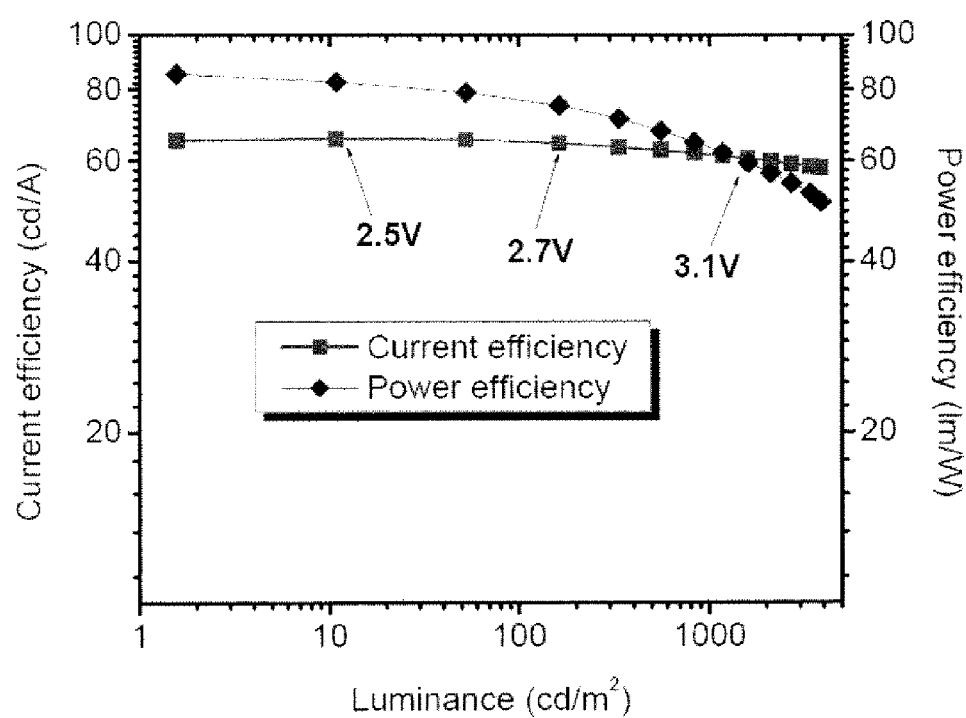
FIG. 1 shows a graph of current efficiency and power efficiency as a function of the luminance for a first embodiment of a light-emitting component.
Figure 2:
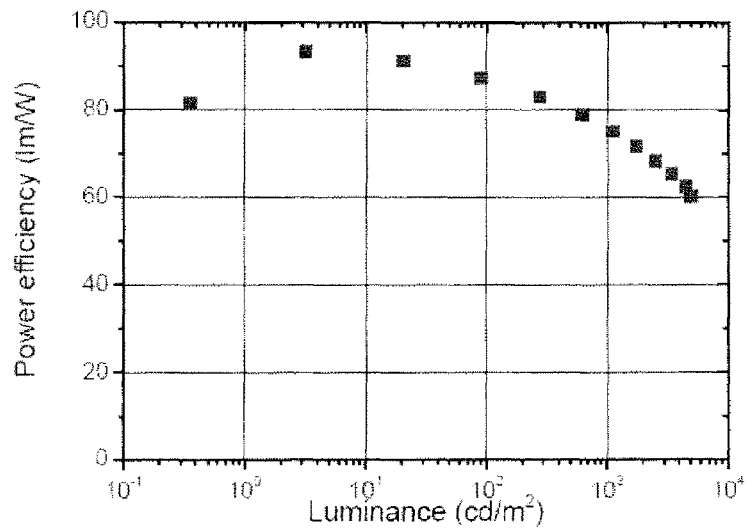
FIG. 2 shows a graph of the power efficiency as a function of the luminance for a second embodiment of a light-emitting component.
Figure 3:
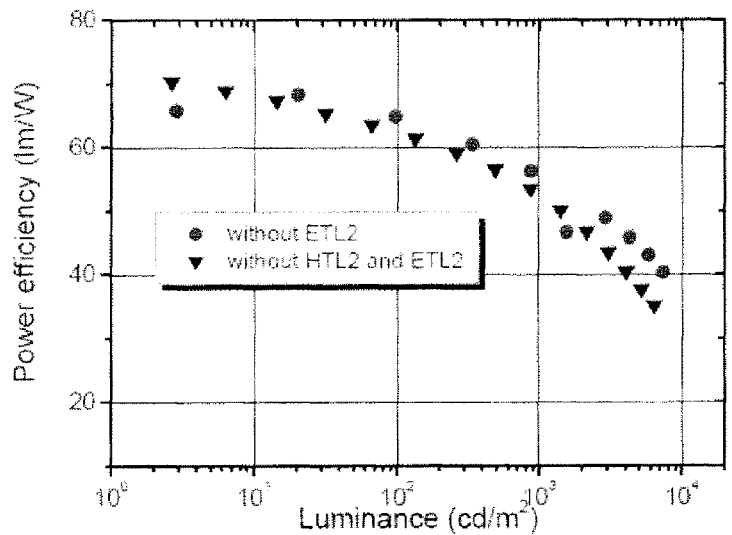
FIG. 3 shows a graph of the power efficiency as a function of the luminance for a fourth embodiment of a light-emitting component.

FIG. 3 shows experimental results for the power efficiency as a function of the luminance for the fourth example (triangles) and the fifth example (circles).

The above-described examples have p-i-n structures, which means that acceptors are incorporated in the hole transport layer and donors are incorporated in the electron transport layer. If the donors in the electron transport layers ETL1, ETL2 are omitted, a p-i-i structure is obtained. If the acceptors in the hole transport layers HTL1, HTL2 are omitted, an i-i-n structure is formed. When donors and acceptors are omitted, an i-i-i structure is formed. All structures can be combined with the above-described structures of EML1 and EML2 in the emission zone.

Example 5

A further example provides a light-emitting component comprising a layer assembly comprising a hole-injecting contact, optionally one or more hole-injecting and hole-transporting layers, a light-emitting region, optionally one or more electron-injecting and electron-transporting layers and an electron-injecting contact, where:
- at least one layer in the light-emitting region is made up of a mixture of a matrix material with a phosphorescence emitter dopant,
- the matrix material is a covalently coupled dyad made up of a bipolar or electron-transporting structure and a bipolar or hole-transporting structure, and
- the dyad material comprises subunits having separate π electron systems.

This light-emitting component of Example 5 is preferably made up so that one of the subunits of the dyad can preferentially take up additional holes so that one HOMO wave function concentrates on the one of the two subunits and that another of the subunits of the dyad can preferentially take up additional electrons so that the LUMO wave function concentrates on this (donor-acceptor dyad).

Such an ambipolarity of the transport in the light-emitting region also leads to an improvement, since ambipolarity generally widens the generation zone and is no longer concentrated exclusively in the immediate vicinity of an interface. This applies particularly when the charge carrier mobilities are set independently of one another in a material in order to achieve very balanced conditions and thus preferred generation in the middle of the EML. This is achieved by the use of donor-acceptor dyads (DADs) made up of two parts having complementary transport characteristics, since the subunits can be optimized individually for electron transport and hole transport.

In addition, the use of dyads has the following advantages in terms of the efficiency of phosphorescent OLEDs. A low operating voltage is desirable in principle for OLEDs. The energy of a charge carrier pair in the transport material (matrix) of the emission zone should ideally be a little greater than the triplet energy of the phosphorescence dopant. At the same time, the lowest triplet level of the transport materials in the emission zone has to have a higher energy than the triplet level of the emitter dopant, since otherwise the triplet exciton of the emitter is quenched by the matrix material. These two requirements are contradictory insofar as the triplet energy is generally significantly lower than the singlet energy (optical energy gap) or the energy of the free charge carrier pair (electric energy gap) due to exchange interaction. Here, the difference between singlet energy and triplet energy correlates with the spatial overlap of HOMO and LUMO. The difference in the case of dyads in which the HOMO is restricted to a different subunit than the LUMO is thus negligibly small. If the difference between the HOMO energies and also between the LUMO energies of the subunits is sufficiently large, the lowest singlet excited state of the DAD is a charge transfer exciton which has a lower exciton binding energy than a molecular Frenkel exciton, so that optical and electric energy gaps also move closer together. Overall, the difference between the electric energy gap of the matrix and the triplet energy of the phosphorescence dopant can thus be significantly reduced when using DADs compared to materials having HOMOs and LUMOs which have a large overlap.

Figure 4:
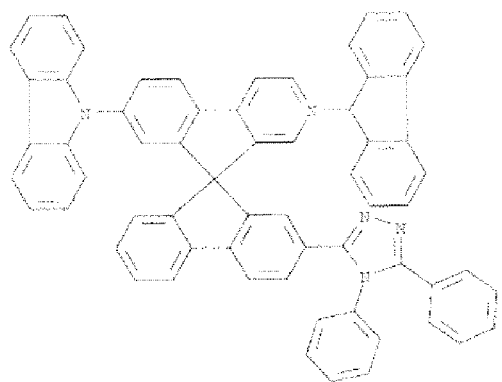
FIG. 4 shows a dyad made up of a spiro-linked molecule of CBP and a TAZ unit (such molecules will hereinafter be referred to as DADs=donor-acceptor dyads)

A possible realization of such a DAD is a spiro-linked molecule made up of CBP and a TAZ unit, as shown in FIG. 4. The electric energy gap is produced by the HOMO of CBP and the LUMO of TAZ, while the lowest singlet and triplet excited states correspond to the values of the two components.

Energy Level Diagrams

Energy level diagrams for various embodiments which include the above-described examples at least in part and also further embodiments are described below with reference to FIGS. 5 to 12.

FIG. 5 schematically shows the energy levels for a) a simple material having a contiguous π electron system, for b) subunits D (donor subunit) and A (acceptor subunit) of a DAD in which at least one of the energy differences between HOMO levels or LUMO levels of the subunits is so small, preferably less than about 0.5 eV, that the lowest singlet excited state is a Frenkel exciton on one of the subunits, and for c) subunits D (donor subunit) and A (acceptor subunit) of a DAD in which at least one of the energy differences between HOMO levels or LUMO levels of the subunits is so large, preferably greater than about 0.4 eV, that the lowest singlet excited state is a charge transfer exciton consisting of an electron on the subunit A and a hole on the subunit D.

The example of FIG. 5c) describes an energetically optimal situation which leads to minimal operating voltages. However, to improve the efficiency of energy transfer or to avoid quenching processes for charge-transfer excitons, which often lead to considerable vibronic relaxation processes, it can be useful to go over to the energetically less optimal situation which is defined in FIG. 5b) and in which the lowest excited state is a Frenkel exciton on one of the subunits, since one of the energy differences ("offset") is smaller than the binding energy of Frenkel excitons. An advantage in respect of the operating voltage compared to simple materials having a high spatial HOMO-LUMO overlap is nevertheless retained: although the difference between singlet and triplet excitation is not reduced here, optical and electric energy gaps move closer together.

To avoid confusion between single-particle levels and energies of excited states, the levels in FIG. 5 for electrons/holes have been denoted by $E_e/E_h$. This corresponds essentially to the LUMO/HOMO energies of the subunits, although the term LUMO in particular is not used in a uniform fashion in the literature, while the excitation energies are denoted by $S_n$ or $T_n$ depending on the spin multiplicity. CT denotes the energy of a charge transfer exciton formed by an electrode on the subunit A and a hole on the subunit D, which is largely independent of the spin multiplicity. In cases b) and c) in FIG. 5, the matrix has a smaller electric energy gap ($E_g^{el}$) at the same triplet energy, so that the phosphorescent light-emitting diode can operate at a lower operating voltage.

FIG. 6 schematically shows an energy level diagram for an example in which the material (M1) for one of the layers EML1 in the emission zone comprises an ambipolar, single-component material and the other material (M2) for another of the layers EML2 in the emission zone comprises an electron-only matrix, with hole transport being able to occur by hopping between dopant states.

An upper line denotes the LUMO level, i.e. the respective electron transport level. The bottom line denotes the HOMO level, i.e. the hole transport level. Furthermore, an anode A and a cathode K which are symbolized by their Fermi level are also shown. In the example presented, it is assumed that HTL1 is p-doped and HTL2 is n-doped. The energy levels shown as broken lines in the emission layers EML1 and EML2 in FIG. 6 symbolize the levels of the emitter dopants. Arrows 60, 61 indicate the energy level on which charge carrier transport takes place. Arrows 62, 63 indicate the preferred transport type of a material system. The energetic arrangement of the HOMO energy level and the LUMO energy level in the EMLs is important, and it is also important that the HOMO offset between HTL2 and EML1 and the LUMO offset between ETL2 and EML2 are not too great. This offset is preferably less than about 0.5 eV, more preferably less than about 0.3 eV.

FIG. 7 schematically shows an energy level diagram for an example in which the material (M1) for one of the layers EML1 in the emission zone comprises a mixture of a hole-transporting material, an electron-transporting material and a triplet emitter dopant and the other material (M2) for another of the layers EML2 in the emission zone comprises an electron-only matrix, with hole transport being able to occur by hopping between dopant states. The dotted lines denote the energy levels of the emitter dopant. The stroke-dot line denotes the energy level of an electron transport component in EML1. Finally, the continuous line in EML1 denotes the energy level of the hole transport component.

FIG. 8 schematically shows an energy level diagram for an example in which the material (M1) for one of the layers EML1 in the emission zone comprises a hole-only matrix, with electron transport being able to occur by hopping between dopant states, and the other material (M2) for another of the layers EML2 in the emission zone comprises an ambipolar, single-component material.

FIG. 9 schematically shows an energy level diagram for an example in which the material (M1) for one of the layers EML1 in the emission zone comprises a hole-only matrix, with electron transport being able to occur by hopping between dopant states, and the other material (M2) for another of the layers EML2 in the emission zone comprises a mixture of a hole-transporting material, an electron-transporting material and a triplet emitter dopant. The broken lines once again denote the energy level of the triplet emitter dopant. The stroke-dot lines in FIG. 9 denote the energy levels of the electron transport component in the layer EML2. Finally, the continuous line in the layer EML2 denotes the energy level of the hole transport component.

FIG. 10 schematically shows an energy level diagram for an example in which the material (M1) for one of the layers EML1 in the emission zone and the other material (M2) for another of the layers EML2 in the emission zone are each made up of a single-component, ambipolar material or a mixture of a hole-transporting material and an electron-transporting material. Only the energy levels which are important for transport are shown for the transport materials in the layers EML1 and EML2; the nonparticipating energy levels in the case of mixed materials are not shown.

FIG. 11 schematically shows an energy level diagram for an example in which hole transport in both the materials (M1) and (M2) for the layers EML1, EML2 in the emission zone takes place by hopping between states of the triplet emitter dopant, with a HOMO level of a matrix material in the material (M1) being closer to a HOMO level of the triplet emitter dopant than in the other material (M2), so that a tunnelling barrier for hopping between the triplet emitter dopants in the material (M1) in EML1 is smaller than a tunnelling barrier for hopping between the dopants in the other material (M2) in EML2 and the effective hole mobility in the material (M1) is greater than the effective hole mobility in the other material (M2).

Only the energy levels which are important for transport are shown for the transport materials in the layers EML1 and EML2; the nonparticipating energy levels in the case of mixed materials are not shown. The energy levels are arranged similarly to the energy levels in the example corresponding to FIG. 6, with the difference being that hole transport by hopping between the triplet emitter dopants in the layer EML1 is now assumed. Whether transport occurs by hopping between triplet emitter dopants or as transport in the matrix with the dopants as traps depends both on the dopant concentration and on the trap depth, which is the energy difference between the HOMO energy level of the matrix and the HOMO energy level of the triplet emitter dopants.

FIG. 12 shows an energy level diagram for an example in which electron transport in the material (M1) for the layer EML1 takes place in the emission zone and that in the other material (M2) for the layer EML2 in the emission zone takes place by hopping between states of the triplet emitter dopant, with a LUMO level of a matrix material in the other material (M2) being closer to a LUMO level of the triplet emitter dopant than in the material (M1), so that a tunnelling barrier for hopping of electrons between the triplet emitter dopants in the other material (M2) is smaller than a tunnelling barrier for hopping between the dopants in the material (M1) and the effective electron mobility in the other material (M2) is greater than the effective electron mobility in the material (M1).

Only the energy levels important for transport are shown for the transport materials in the layers EML1 and EML2 in FIG. 12; the nonparticipating energy levels in the case of mixed materials are not shown. The energy levels are arranged similarly to the example in FIG. 9, with the difference being that electron transport in the layer EML2 now occurs by means of direct hopping between the dopants.

Further Examples of Materials

Further examples of materials which can be employed in the various embodiments described are given below.

In the examples described, the following materials can be used as preferentially or exclusively hole-transporting matrix materials in the emission zone:

1) A molecule comprising triarylamine units, in particular derivatives of TPD, NPD or their spiro-liked dyads (spiro linkage is described, for example, in the document U.S. Pat. No. 5,840,217), derivatives of TDATA such as m-MTDATA, TNATA, etc., or derivatives of TDAB (cf. Y. Shirota, J. Mater. Chem., 10 (1), 1-25 (2000)).

TDAB:

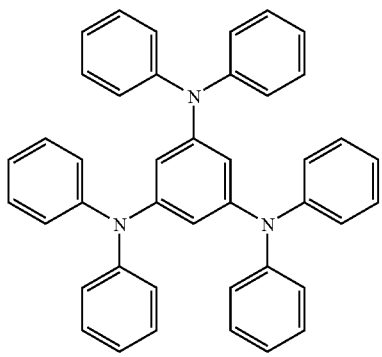 [SMILES: c1ccc(N(c2ccccc2)c2cc(N(c3ccccc3)c3ccccc3)cc(N(c3ccccc3)c3ccccc3)c2)cc1]

Starburst=TDAB
1,3,5-tris(diphenylamino)benzene
Further aromatic amines are described in the documents US 2002/098379 and U.S. Pat. No. 6,406,804.
2) A molecule comprising thiophene units.
3) A molecule comprising phenylene-vinylene units.

The following components can be used as preferentially or exclusively electron-transporting matrix materials for the layers EML in the emission zone:
1) Oxadiazoles
   OXD:

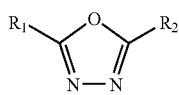

2) Triazoles
   TAZ:

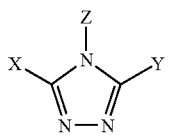

3) Benzothiadiazoles

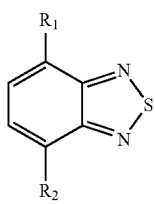

4) Benzimidazoles

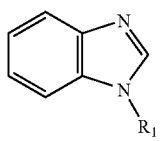

in particular N-arylbenzimidazoles such as TPBI

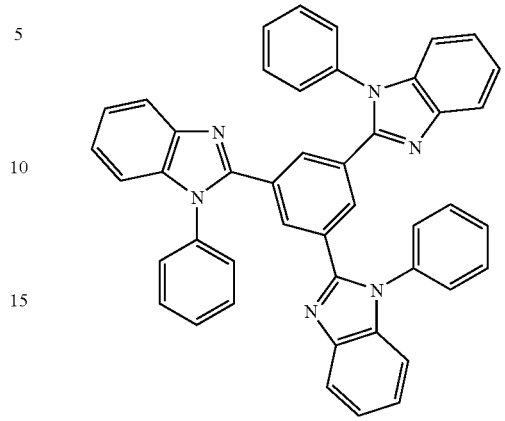

5) Bipyridines

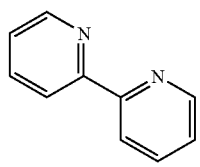 [SMILES: c1ccc(-c2ccccn2)nc1]

6) Molecules having cyanovinyl groups (cf. K. Naito, M. Sakurai, S. Egusa J. Phys. Chem. A, 101, 2350 (1997)), in particular 7- or 8-cyano-para-phenylene-vinylene derivatives

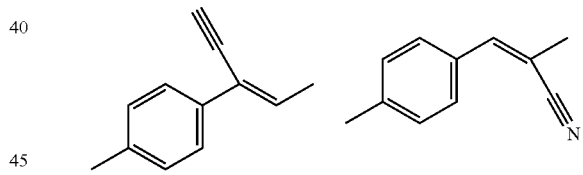

7) Quinolines

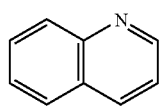

8) Quinoxalines (cf. M. Redecker, D. D. C. Bradley, M. Jandke, P. Strohriegl, Appl. Phys. Lett., 75 (1), 109-111 (1999))

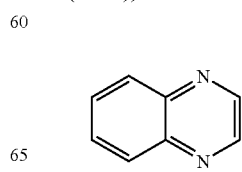

9) Triarylboryl derivatives (cf. Y. Shirota, J. Mater. Chem., 10 (1), 1-25 (2000))

or
1,2-bis(1-methyl-2,3,4,5-tetraphenylsilacyclopentadienyl)ethane
(2PSP)

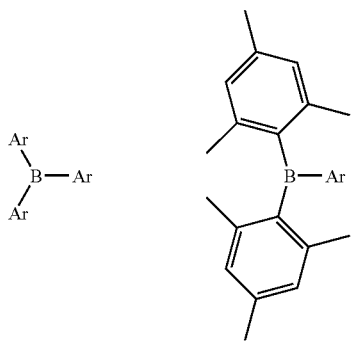

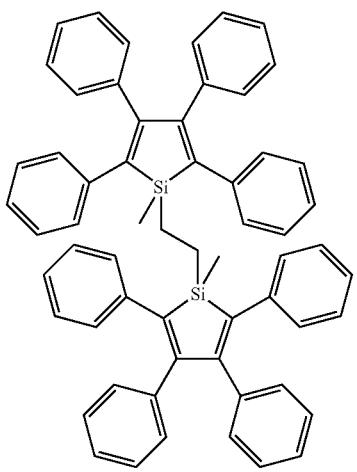

(cf. H. Murata, Z. H. Kafafi, M. Uchida, Appl. Phys. Lett., 80 (2), 189-191 (2002))

11) Cyclooctatetraenes (cf. P. Lu, H. P. Hong, G. P. Cai, P. Djurovich, W. P. Weber, M. E. Thompson, J. Amer. Chem. Soc., 122 (31), 7480-7486 (2000))

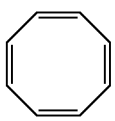

12) Quinoid structures, including quinoidal thiophene derivatives
13) Pyrazolines

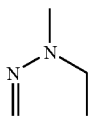

10) Silol derivatives, in particular derivatives of silacyclopentadiene, for example 2,5-bis-(2('),2(')bipyridin-6-yl)-1,1-dimethyl-3,4-diphenylsilacyclopentadiene
(PyPySPyPy)

(cf Z. M. Zhang, R. F. Zhang, F. Wu, Y. G. Ma, G. W. Li, W. J. Tian, J. C. Shen, Chin. Phys. Lett., 17 (6), 454-456 (2000))

14) Other heterocyclic compounds having at least one nitrogen atom or an oxygen atom as heteroatom.
15) Ketones
16) Cyclopentadienyl-based free-radical electron transporters, in particular derivatives of pentaarylcyclopentadiene (cf. U.S. Pat. No. 5,811,833)

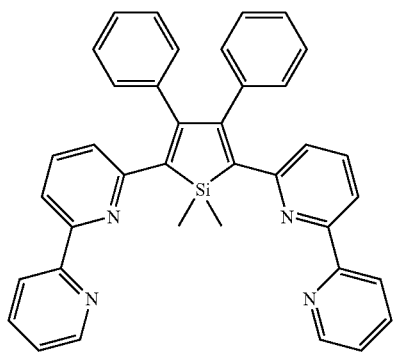 [SMILES: C[Si]1(C)C(c2cccc(-c3ccccn3)n2)=C(c2ccccc2)C(c2ccccc2)=C1c1cccc(-c2ccccn2)n1]

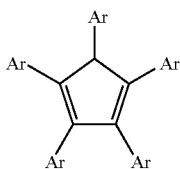

17) Benzothiadiazoles (cf. R. Pacios, D. D. C. Bradley, Synth. Met., 127 (1-3), 261-265 (2002))

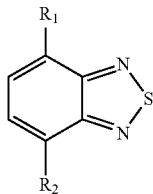

18) Naphthalenedicarboxylic anhydrides

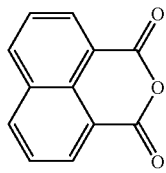 [SMILES: O=C1OC(=O)c2cccc3cccc1c23]

19) Naphthalenedicarboximides

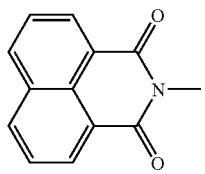 [SMILES: CN1C(=O)c2cccc3cccc(c23)C1=O]

and naphthalenedicarboximidazoles

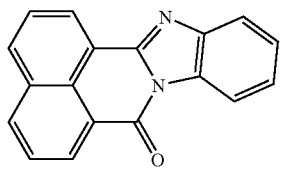 [SMILES: O=c1c2cccc3cccc(c32)c2nc3ccccc3n12]

20) Perfluorinated oligo-para-phenyls (cf. A. J. Campbell, D. D. C. Bradley, H. Antoniadis, Appl. Phys. Lett., 79 (14), 2133-2135 (2001))

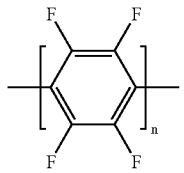

Further possible structural units which promote electron transport are described in the document US 20002/098379.

In a further embodiment of the light-emitting component, the bipolar, single-component material belongs to one of the following classes of materials:

1) Covalently coupled dyads made up of a bipolar or electron-transporting structure and a bipolar or hole-transporting structure, with the substructures having separate π electron systems.

Such structures have been realized, for example, as a spiro linkage of a donor unit and an acceptor unit (cf., for example, DE 44 46 818 A1, R. Pudzich, J. Salbeck, Synthet. Metal., 138, 21 (2003) and T. P. I. Saragi, R. Pudzich, T. Fuhrmann, J. Salbeck, Appl. Phys. Lett., 84, 2334 (2004)). The focus of the studies of Pudzich and Salbeck was the combination of the functions of charge carrier transport and efficient emission in one molecule and the realization of light-sensitive transistors. A possible particularly advantageous use of such compounds as matrix for phosphorescence emitter dopants as a result of the favourable relationship between the electrical band gap and the lowest triplet level is not mentioned by the authors.

Dyads comprising electron-conducting and hole-conducting structures are also mentioned in the document U.S. Pat. No. 6,406,804. According to this patent, they are intended to serve as matrix for fluorescent emitter molecules.

2) A molecule which, as a result of suitable structural elements having a common π electron system, comprises firstly subunits which preferentially take up additional holes and on which the HOMO wave function is consequently concentrated and secondly further subunits which preferentially take up additional electrons and on which the LUMO wave function is consequently concentrated (cf., for example, Y. Shirota, M. Kinoshita, T. Noda, K. Okumoto, T. Ohara, J. Amer. Chem. Soc., 122 (44), 11021-11022 (2000) or R. Pudzich, J. Salbeck, Synthet. Metal., 138, 21 (2003)).

3) A push-pull-substituted molecule (a molecule which, as a result of suitable electron-pulling and electron-pushing substituents, has subunits which preferentially take up additional holes and on which the HOMO wave function is consequently concentrated and other subunits which preferentially take up additional electrons and on which the LUMO wave function is consequently concentrated).

4) A molecule comprising carbazole units, in particular CBP.

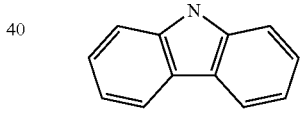

5) A molecule comprising fluorene units (cf. A. J. Campbell, D. D. C. Bradley, H. Antoniadis, Appl. Phys. Lett., 79 (14), 2133-2135 (2001)).

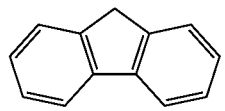

6) A molecule comprising porphyrin or phthalocyanine units (cf. A. Ioannidis, J. P. Dodelet, J. Phys. Chem. B, 101 (26), 5100-5107 (1997)).

7) A molecule comprising para-oligophenyl having more than three phenyl units coupled in the para positions.

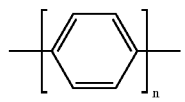

8) A molecule comprising anthracene, tetracene or pentacene units.

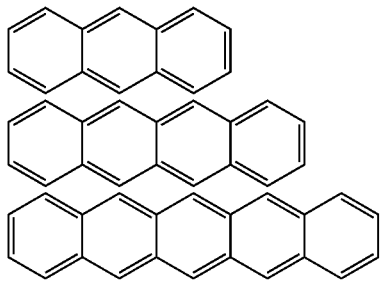

9) A molecule comprising perylene.

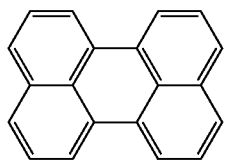 [SMILES: c1cc2cccc3c4cccc5cccc(c(c1)c23)c54]

10) A molecule comprising pyrene.

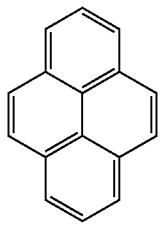

The features of the invention disclosed in the above description and in the claims can be of importance in their various embodiments either individually or in any combination for the realization of the invention.

The invention claimed is:

1. A layer assembly for a light-emitting component, comprising a hole-injecting contact and an electron-injecting contact which are each connected to a light-emitting region comprising one light-emitting layer and an other light-emitting layer, wherein:
the one light-emitting layer comprises one material and the other light-emitting layer comprises an other material, wherein the one material is ambipolar and has a charge carrier mobility for holes that is greater than the one material's charge carrier mobility for electrons, and the other material is ambipolar and has a charge carrier mobility for electrons that is greater than the other material's charge carrier mobility for holes; wherein the one material and the other material each comprise one or more triplet emitter dopants; wherein the other material comprises either a single-component ambipolar material or an electron-only matrix, wherein hole transport occurs in the electron-only matrix by hopping between states of the one or more triplet emitter dopants;
a heterotransition is formed by the one material and the other material in the light-emitting region;
an interface between the one material and the other material is of a staggered type II; and
an energy barrier for transfer of holes from the one material into the other material and an energy barrier for transfer of electrons from the other material into the one material are each less than about 0.4 eV.

2. A layer assembly according to claim 1, wherein at least one of the energy barriers for the transfer of holes from the one material into the other material and the transfer of electrons from the other material into the one material is less than about 0.3 eV.

3. A layer assembly according to claim 1, wherein the one material comprises an ambipolar, single-component material, and the other material comprises an electron-only matrix, wherein hole transport occurs by hopping between states of the one or more triplet emitter dopants.

4. A layer assembly according to claim 1 wherein the one material comprises a mixture comprising a material that has a charge carrier mobility for holes that is greater than the material's charge carrier mobility for electrons, a second material that has a charge carrier mobility for electrons that is greater than the second material's charge carrier mobility for holes, and the one or more triplet emitter dopants; and the other material comprises an electron-only matrix, wherein hole transport occurs by hopping between states of the one or more triplet emitter dopants.

5. A layer assembly according to claim 1, wherein hole transport in the one material and the other material takes place as hopping between states of the one or more triplet emitter dopants, wherein a HOMO level of a matrix material is closer to a HOMO level of the one or more triplet emitter dopants in the one material rather than the other material so that a tunnelling barrier for hopping between the states of the one or more triplet emitter dopants in the one material is smaller than a tunnelling barrier for hopping between the states of the one or more triplet emitter dopants in the other material, and the hole mobility in the one material is greater than the hole mobility in the other material.

6. A layer assembly according to claim 1, wherein electron transport in the one material and other material takes place as hopping between states of the one or more triplet emitter dopants, wherein a LUMO level of a matrix material is closer to a LUMO level of the one or more triplet emitter dopants in the other material than in the one material so that a tunnelling barrier for hopping of electrons between the states of the one or more triplet emitter dopants in the other material is smaller than a tunnelling barrier for hopping between the states of the one or more triplet emitter dopants in the one material and the electron mobility in the other material is greater than the electron mobility in the one material.

7. A layer assembly according to claim 1, wherein a matrix material for the one material and/or the other material comprises a covalently coupled dyad comprising an ambipolar or electron-transporting structure and an ambipolar or hole-transporting structure, and the dyad has subunits comprising separate π electron systems.

8. A layer assembly according to claim 7, wherein one of the subunits of the dyad can take up additional holes so that a HOMO wave function is concentrated on this one of the subunits, and another of the subunits of the dyad can take up additional electrons so that the LUMO wave function is concentrated on the other one of the subunits, thus forming a donor-acceptor dyad.

9. A layer assembly according to claim 7, wherein at least one of the energy offsets between HOMO levels or LUMO levels of the subunits is less than about 0.5 eV, wherein the lowest singlet excited state is a Frenkel exciton on one of the subunits.

10. A layer assembly according to claim 7, wherein the energy offset both for the HOMO levels and for the LUMO levels of the subunits is greater than about 0.4 eV, wherein the lowest singlet excited state is a charge transfer exciton consisting of an electron on an acceptor subunit and a hole on a donor subunit.

11. A layer assembly according to claim 8, wherein the one subunit which takes up additional holes comprises a material from one or more of the following classes of materials:
- a molecule comprising triarylamine units;
- a molecule comprising thiophene units; or
- a molecule comprising phenylene-vinylene units.

12. A layer assembly according to claim 8, wherein the other subunit which takes up additional electrons comprises a material from one or more of the following classes of materials:
- oxadiazoles;
- triazoles;
- benzothiadiazoles;
- benzimidazoles;
- bipyridines;
- molecules having cyanovinyl groups;
- quinolines;
- quinoxalines;
- triarylboryl derivatives;
- silol derivatives;
- cyclooctatetraenes;
- quinoid structures;
- pyrazolines;
- ketones;
- cyclopentadienyl-based free-radical electron transporters; or
- benzothiadiazoles.

13. A layer assembly according to claim 7, wherein the subunits of the dyad are linked by means of a spiro compound.

14. A layer assembly according to claim 1, comprising at least one layer selected from the group consisting of: an electron transport layer, a hole transport layer, an electron-blocking layer, and a hole-blocking layer.

15. A layer assembly according to any of claim 14, wherein a p-i-i structure is formed.

16. A layer assembly according to claim 14, wherein an i-i-n structure is formed.

17. A layer assembly according to claim 4, wherein the mixture comprising the material with a charge carrier mobility for holes that is greater than the material's charge carrier mobility for electrons, the second material with a charge carrier mobility for electrons that is greater than the second material's charge carrier mobility for holes, and the one or more triplet emitter dopants comprises a material from one or more of the following classes of materials:
- a molecule comprising triarylamine units;
- a molecule comprising thiophene units; or
- a molecule comprising phenylene-vinylene units.

18. A layer assembly according claim 4, wherein the mixture of the material with a charge carrier mobility for holes that is greater than the material's charge carrier mobility for electrons, the second material with a charge carrier mobility for electrons that is greater than the second material's charge carrier mobility for holes, and the one or more triplet emitter dopants, comprises a material from one or more of the following classes of materials:
- oxadiazoles;
- triazoles;
- benzothiadiazoles;
- benzimidazoles;
- bipyridines;
- molecules having cyanovinyl groups;
- quinolines;
- quinoxalines;
- triarylboryl derivatives;
- silol derivatives;
- cyclooctatetraenes;
- quinoid structures;
- pyrazolines;
- ketones;
- cyclopentadienyl-based free-radical electron transporters;
- benzothiadiazoles;
- naphthalenedicarboxylic anhydrides, naphthalenedicarboximides and naphthalenedicarboximidazoles; or
- perfluorinated oligo-para-phenyls.

19. A layer assembly according to claim 3, wherein the ambipolar, single-component material comprises one of the following materials:
- covalently coupled dyads comprising a bipolar or electron-transporting structure and a bipolar or hole-transporting structure, wherein the substructures comprise a separate π electron system;
- a molecule which, as a result of suitable structural elements having a common π electron system, comprises firstly subunits which take up additional holes and on which the HOMO wave function is consequently concentrated and secondly further subunits which take up additional electrons and on which the LUMO wave function is consequently concentrated;
- a push-pull substituted molecule;
- a molecule comprising carbazole units;
- a molecule comprising fluorene units;
- a molecule comprising porphyrin or phthalocyanine units;
- a molecule comprising para-oligophenyl having more than three phenyl units coupled in para positions;
- a molecule comprising anthracene, tetracene or pentacene units;
- a molecule comprising perylene; or
- a molecule comprising pyrene.

20. A layer assembly according to claim 1, wherein the one light-emitting layer and the other light-emitting layer each have a layer thickness of less than about 30 nm.

21. A layer assembly according to claim 1, wherein the light-emitting region comprises at least one additional light-emitting layer.

22. A layer assembly according to claim 14, wherein a p-i-n structure is formed.

23. A layer assembly according to claim 14, wherein an energy barrier to injection of holes from an effective hole transport level of the other light-emitting layer into an effective hole transport level of an adjoining electron transport layer is less than about 0.4 eV, so that the adjoining electron transport layer is an inefficient hole-blocking layer, wherein the other light-emitting layer comprises an adjoining electron transport layer.

24. A layer assembly according to claim 14, wherein an energy barrier to injection of electrons from an effective electron transport level of the light-emitting layer into an effective electron transport level of an adjoining hole transport layer is less than about 0.4 eV, so that the adjoining hole transport layer is an inefficient electron-blocking layer, wherein the light-emitting layer comprises an adjoining hole transport layer.

25. A layer assembly according to claim 1, comprising a p-doped hole transport layer, wherein a layer region between the p-doped hole transport layer and the light-emitting region is free of one or more undoped intermediate layers.

26. A layer assembly according to claim 1, wherein the light-emitting region directly adjoins the hole-injecting contact.

27. A layer assembly according to claim 1 comprising an n-doped electron transport layer, wherein a layer region between the n-doped electron transport layer and the light-emitting region is free of one or more undoped intermediate layers.

28. A layer assembly according to claim 1, wherein the other light-emitting layer directly adjoins the electron-injecting contact.

29. A light-emitting component comprising a layer assembly according to claim 1.

* * * * *

UNITED STATES PATENT AND TRADEMARK OFFICE
CERTIFICATE OF CORRECTION

| | | |
|---|---|---|
| PATENT NO. | : 8,653,537 B2 | Page 1 of 1 |
| APPLICATION NO. | : 11/573617 | |
| DATED | : February 18, 2014 | |
| INVENTOR(S) | : He et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1696 days.

Signed and Sealed this
Second Day of June, 2015

Michelle K. Lee
*Director of the United States Patent and Trademark Office*